US008581372B2

(12) United States Patent
Asada et al.

(10) Patent No.: US 8,581,372 B2
(45) Date of Patent: Nov. 12, 2013

(54) SEMICONDUCTOR STORAGE DEVICE AND A METHOD OF MANUFACTURING THE SEMICONDUCTOR STORAGE DEVICE

(75) Inventors: Junichi Asada, Kanagawa (JP); Taku Nishiyama, Kanagawa (JP); Atsuko Seki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 227 days.

(21) Appl. No.: 13/051,405

(22) Filed: Mar. 18, 2011

(65) Prior Publication Data

US 2012/0049378 A1 Mar. 1, 2012

(30) Foreign Application Priority Data

Aug. 31, 2010 (JP) .................................. 2010-194089

(51) Int. Cl.
*H01L 23/495* (2006.01)
*H01L 23/28* (2006.01)

(52) U.S. Cl.
USPC ........... 257/668; 257/666; 257/676; 257/784; 257/723; 257/787; 257/E23.038

(58) Field of Classification Search
USPC ................... 257/666, 676, 668, 784, E23.038
See application file for complete search history.

(56) References Cited

U.S. PATENT DOCUMENTS

| | | | | |
|---|---|---|---|---|
| 5,976,912 A * | 11/1999 | Fukutomi et al. | ............ | 438/110 |
| 6,001,671 A * | 12/1999 | Fjelstad | ............ | 438/112 |
| 6,143,981 A * | 11/2000 | Glenn | ............ | 174/534 |
| 6,410,355 B1 * | 6/2002 | Wallace | ............ | 438/15 |
| 6,548,328 B1 * | 4/2003 | Sakamoto et al. | ............ | 438/121 |
| 6,777,789 B1 * | 8/2004 | Glenn et al. | ............ | 257/676 |
| 6,924,547 B2 | 8/2005 | Kanemoto et al. | | |
| 6,967,395 B1 * | 11/2005 | Glenn et al. | ............ | 257/676 |
| 7,245,007 B1 * | 7/2007 | Foster | ............ | 257/678 |
| 2013/0009300 A1 * | 1/2013 | Yato et al. | ............ | 257/676 |

FOREIGN PATENT DOCUMENTS

| | | |
|---|---|---|
| JP | 2-177553 | 7/1990 |
| JP | 9-204508 | 8/1997 |
| JP | 2003-46053 A | 2/2003 |
| JP | 2004-13738 | 1/2004 |

OTHER PUBLICATIONS

U.S. Appl. No. 13/027,668, filed Feb. 15, 2011, Matsushima.
Office Action issued Dec. 25, 2012, in Japanese Patent Application No. 2010-194089 with English translation.

* cited by examiner

*Primary Examiner* — Nitin Parekh
(74) *Attorney, Agent, or Firm* — Oblon, Spivak, McClelland, Maier & Neustadt, L.L.P.

(57) ABSTRACT

According to one embodiment, a semiconductor storage device includes a plate and an external connection terminal. The plate is molded in a resin mold section. A semiconductor memory chip is placed on the plate. The external connection terminal is exposed to the outer circumferential surface of the semiconductor storage device. The plate includes a plurality of exposed portions exposed to the outer circumferential surface of the resin mold section. The plurality of exposed portions is electrically insulated from each other inside the resin mold section.

14 Claims, 26 Drawing Sheets

SEMICONDUCTOR STORAGE DEVICE AND A METHOD OF MANUFACTURING THE SEMICONDUCTOR STORAGE DEVICE

CROSS-REFERENCE TO RELATED APPLICATIONS

This application is based upon and claims the benefit of priority from the prior Japanese Patent Application No. 2010-194089, filed on Aug. 31, 2010; the entire contents of which are incorporated herein by reference.

FIELD

Embodiments described herein relate generally to a semiconductor storage device and a method of manufacturing the semiconductor storage device.

BACKGROUND

In recent years, a semiconductor storage device using a storage element such as a NAND flash memory has often been used as a storage device of an electronic apparatus such as a mobile phone or a personal computer. An example of the semiconductor storage device used in an electronic apparatus includes a memory card (semiconductor memory card). In the semiconductor storage device, a cap accommodates a sealing section (resin mold section) that seals a semiconductor memory chip placed on a conductive plate by a synthetic resin or the like. In such a related art, it is desirable to provide a semiconductor storage device and a method of manufacturing the semiconductor device capable of reducing the number of constituent elements or manufacturing cost.

DETAILED DESCRIPTION

In general, according to one embodiment, a semiconductor storage device in which a semiconductor memory chip is molded in a resin mold section. The semiconductor storage device includes a plate and an external connection terminal.

The semiconductor memory chip is molded in the resin mold section and is placed in the plate. The external connection terminal is exposed to the outer circumferential surface of the semiconductor storage device. The plate includes a plurality of exposed portions exposed to the outer circumferential surface of the resin mold section. The plurality of exposed portions is electrically insulated from each other inside the resin mold section.

Exemplary embodiments of the semiconductor storage device and a method of manufacturing the semiconductor storage device will be explained below in detail with reference to the accompanying drawings. The present invention is not limited to the following embodiments.

Figure 1:
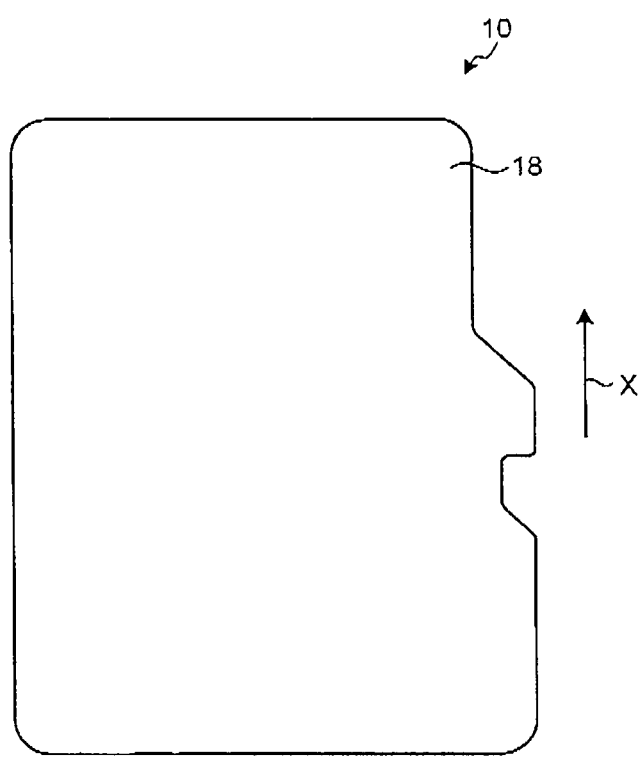
FIG. 1 is a plan view illustrating the outer appearance of a semiconductor storage device according to a first embodiment.
Figure 2:
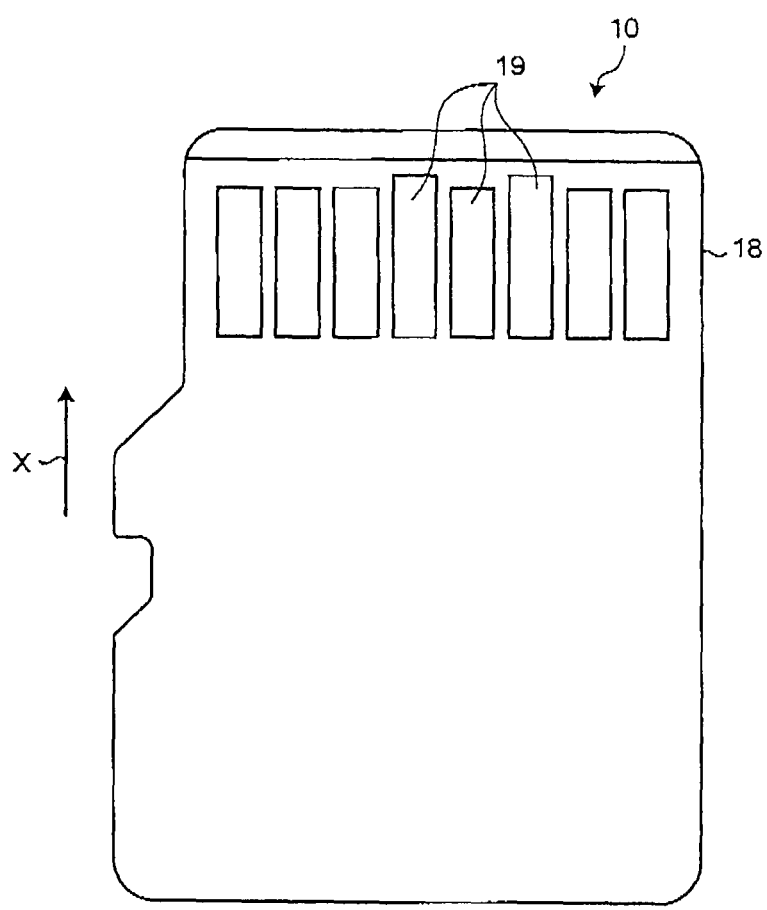
FIG. 2 is a bottom plan view illustrating the outer appearance of the semiconductor storage device shown in FIG. 1.
Figure 3:
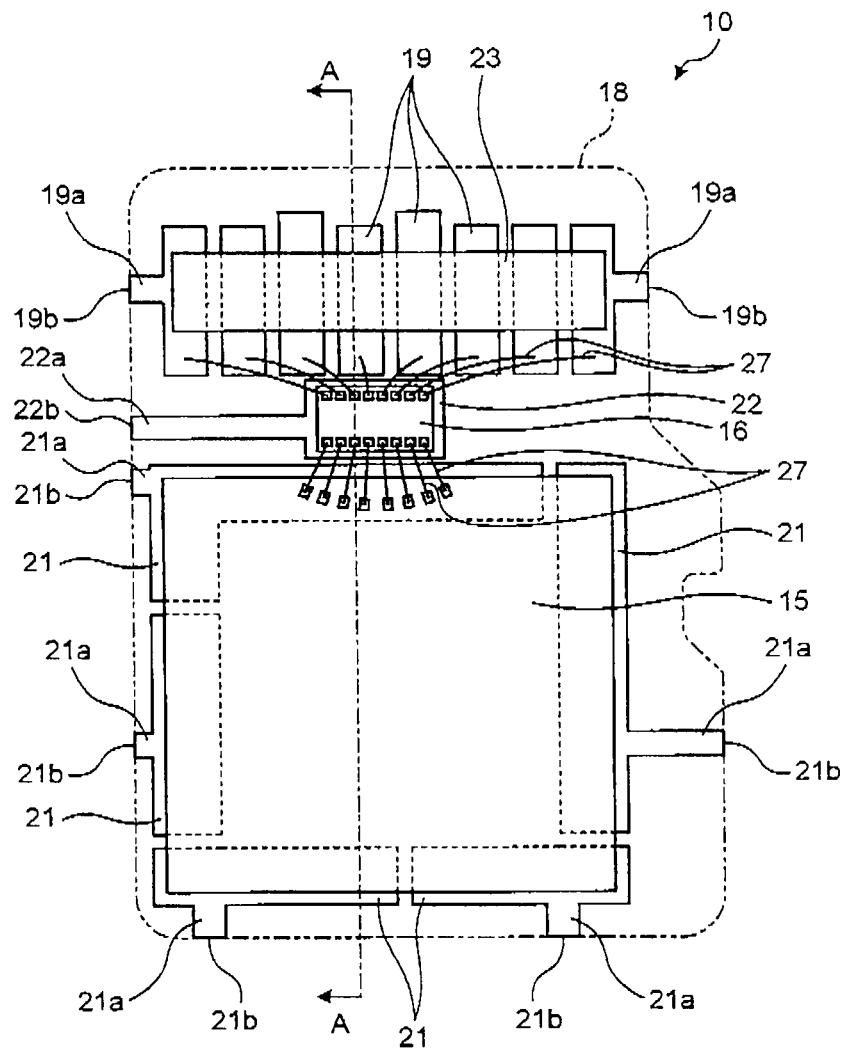
FIG. 3 is a plan view schematically illustrating the inner configuration of the semiconductor storage device shown in FIG. 1.
Figure 4:
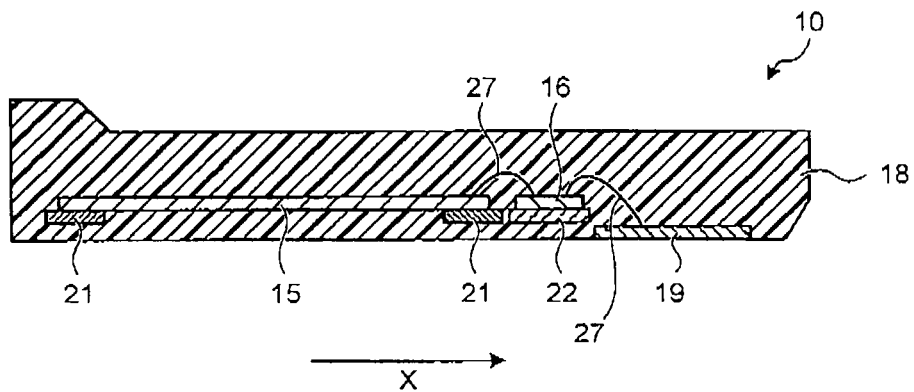
FIG. 4 is a transverse cross sectional view illustrating the cross-section structure of the semiconductor storage device taken along the line A-A of FIG. 3.

First, the overall configuration of the semiconductor storage device will be described. FIG. 1 is a plan view illustrating the outer appearance of the semiconductor storage device according to a first embodiment. FIG. 2 is a bottom plan view illustrating the outer appearance of the semiconductor storage device shown in FIG. 1. FIG. 3 is a plan view schematically illustrating the inner configuration of the semiconductor storage device shown in FIG. 1. FIG. 4 is a transverse cross sectional view illustrating the cross-section structure of the semiconductor storage device taken along the line A-A of FIG. 3. When a semiconductor storage device 10 is used, the semiconductor storage device 10 is inserted into a socket installed in an external apparatus such as a personal computer or a digital camera. The semiconductor storage device 10 functions as an external storage device. An arrow X denotes an insertion direction of the semiconductor storage device 10.

The semiconductor storage device 10 includes a semiconductor memory chip 15, a controller chip 16, terminal plates (external connection terminal) 19, memory chip plates (plate) 21, a control chip plate (plate) 22, and a resin mold section 18. In the semiconductor storage device 10, as shown in FIGS. 1 and 2, the outer circumferences of the terminal plates 19 are covered with the resin mold section 18 in a state where the terminal plates 19 serving as an external connection terminal are exposed to the bottom surface of the semiconductor storage device 10. The semiconductor storage device 10 has a substantially square shape in a plan view by covering the semiconductor storage device 10 with the resin mold section 18.

The semiconductor memory chip 15 is a storage element such as a NAND flash memory. The semiconductor memory chip 15 has a plurality of electrode pads at least in one side thereof. The controller chip 16 writes data into the semiconductor memory chip 15 or reads data from the semiconductor memory chip 15. When the semiconductor storage device 10 includes the plurality of semiconductor memory chips 15, the controller chip 16 selects the semiconductor memory chips 15 writing or reading data. Electrode pads are formed on the upper surface of the controller chip 16.

The terminal plates 19 include a plurality of metal plates arranged. One surface of each of the terminal plates 19 is exposed to the bottom surface of the semiconductor storage device 10. Thus, the terminal plates 19 serve as input/output terminals, that is, external connection terminals, when the semiconductor storage device 10 is inserted into an external apparatus. Among the terminal plates 19 arranged, the terminal plates 19 arranged in both ends each have a lead portion 19a extending toward the side surface of the resin mold section 18. A part of the lead portion 19a becomes an exposed portion 19b exposed to the outer circumferential surface of the resin mold section 18. Only one exposed portion 19b is formed in one terminal plate 19. The plurality of plates 19 arranged are connected to each other by a fixing tape 23. The fixing tape 23 is formed of an insulation material. Thus, the terminal plates 19 are electrically insulated from each other.

The memory chip plates 21 are used to place the semiconductor memory chip 15, before the resin mold section 18 is formed. The memory chip plates 21 support the semiconductor memory chip 15 from the bottom surface thereof. The memory chip plates 21 are overall arranged in the portions other than the middle region, that is, the outer circumference of the bottom surface of the semiconductor memory chip 15. The memory chip plates 21 are configured to be divided into a plurality of metal plates. The memory chip plates 21, which are divided into multiple plates, each have a lead portion 21a extending toward the side surface of the resin mold section 18. A part of the lead portion 21a becomes an exposed portion 21b exposed to the outer circumferential surface of the resin mold section 18. Only one exposed portion 21b is formed in one memory chip plate 21.

The semiconductor memory chip 15 is attached to the memory chip plates 21 by an adhesive material. An example of the adhesive material includes a thermosetting or photo-setting die attach film (adhesive film) or a liquid material which mainly contains general polyimide resin, epoxy resin, acrylic resin, or the like.

The controller chip plate 22 is used to place the controller chip 16, before the resin mold section 18 is formed. The controller chip plate 22 supports the controller chip 16 from the bottom surface thereof. The controller chip plate 22 has a lead portion 22a extending toward the side surface of the resin mold section 18. A part of the lead portion 22a becomes an exposed portion 22b exposed to the outer circumferential surface of the resin mold section 18. Only one exposed portion 22b is formed in the controller chip plate 22. The controller chip plate 22 may be divided into a plurality of metal plates. In this case, only one exposure 22b is formed in one metal plate.

Electrode pads of the semiconductor memory chip 15 are wire-bonded with electrode pads of the controller chip 16 by metal wires 27 such as Au wires so that they are electrically connected to each other. Electrode pads of the controller chip 16 are wire-bonded with the terminal plates 19 by metal wires 27 such as Au wires so that they are electrically connected to each other.

The resin mold section 18 is formed by sealing the semiconductor memory chip 15, the controller chip 16, the terminal plates 19, the memory chip plates 21, and the control chip plate 22 with a synthetic resin material while exposing one surfaces of the terminal plates 19. The resin mold section 18 forms the outline of the semiconductor storage device 10. The resin mold section 18 is formed so as to have a height completely covering the semiconductor memory chip 15 or the controller chip 16. The resin mold section 18 is formed by covering the plates 19, 21, and 22 with a metal mold when the components such as the semiconductor memory chip 15 are mounted and by filling the inside of the metal mold with a soft synthetic resin material.

Figure 5:
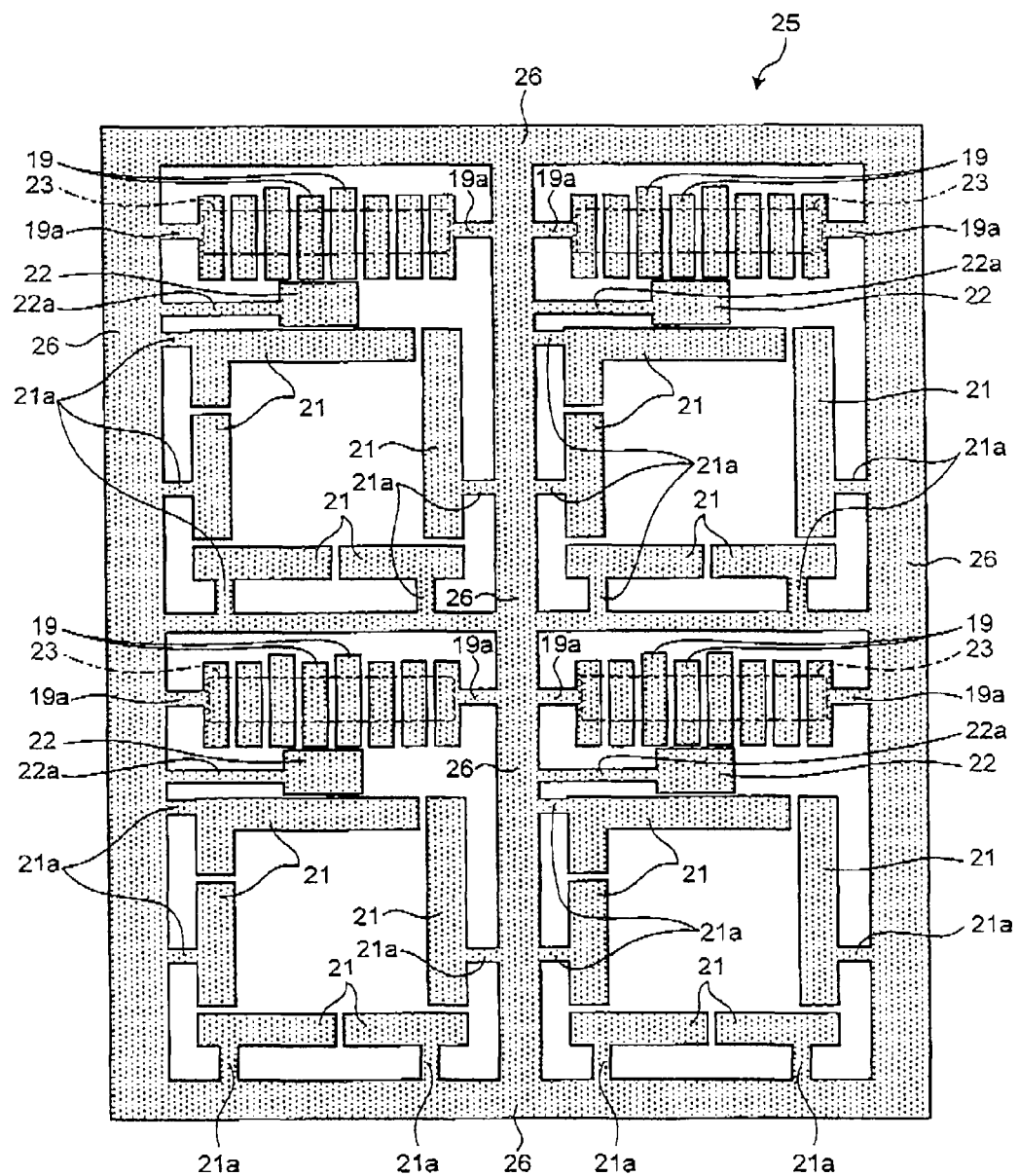
FIG. 5 is a plan view illustrating a lead frame.

Next, the process of manufacturing the semiconductor storage device 10 will be described. FIG. 5 is a plan view illustrating a lead frame. A lead frame 25 is formed of one sheet of metal plate. The plates 19, 21, and 22 are integrally formed to a frame portion 26 via the lead portions 19a, 21a, and 22a. The plates 19, 21, and 22 connected to the frame portion 26 are disposed at the same positions as those of the manufactured semiconductor storage device 10. The plates 19, 21, and 22 are formed in the lead frame 25 in a unit of a plurality of constituent elements so that a plurality of the semiconductor storage devices 10 can be manufactured from one sheet of lead frame 25. The semiconductor storage devices 10 are manufactured from the lead frame 25 by performing the process described below. The terminal plates 19 with no lead portion 19a are positioned and fixed by being connected to the terminal plates 19 arranged in both ends by the fixing tape 23 in the lead frame 25. The lead frame 25 is manufactured by punching a metal plate. When the metal plate is punched, the fixing tape 23 is placed in advance at the regions where the terminal plates 19 are punched. Then, when the punching process is performed, the terminal plates 19 can be also fixed by the fixing tape 23.

Figure 6:
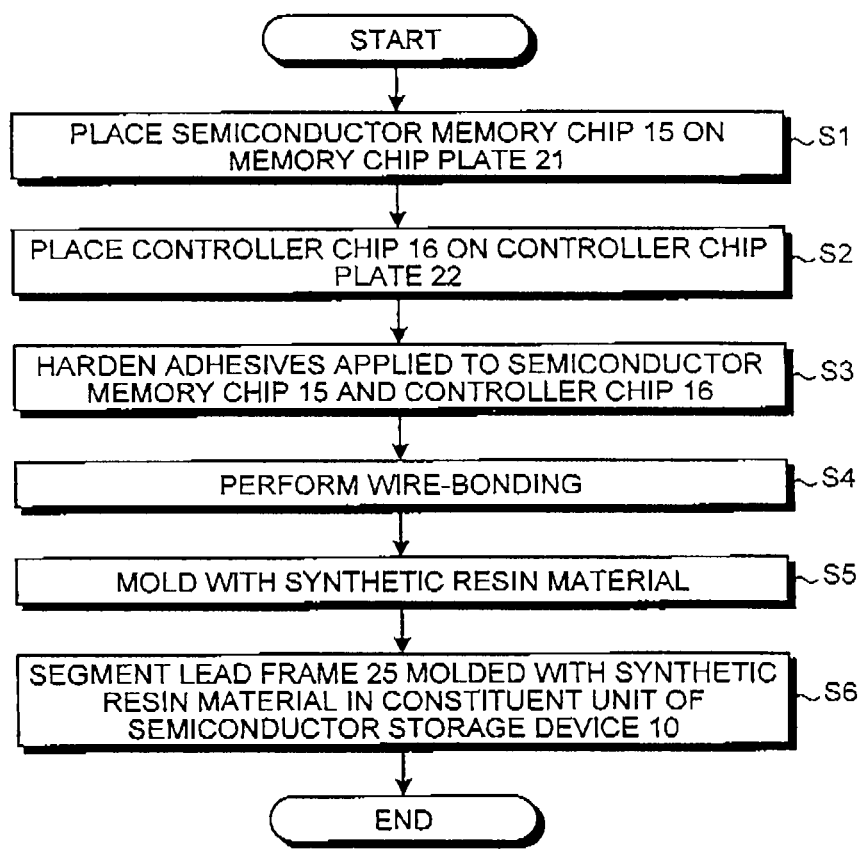
FIG. 6 is a flowchart illustrating a process of manufacturing the semiconductor storage device.

FIG. 6 is a flowchart illustrating the process of manufacturing the semiconductor storage device 10. In step S1, the semiconductor memory chip 15 applied with an adhesive is first placed on the memory chip plates 21 of the lead frame 25. In step S2, the controller chip 16 applied with an adhesive is placed on the controller chip plate 22. In step S3, the adhesives applied to the semiconductor memory chip 15 and the controller chip 16 are hardened.

In step S4, the electrode pads of the controller chip 16 and the terminal plates 19 are wire-bonded by the metal wires and the electrode pads of the controller chip 16 and the semiconductor memory chip 15 are wire-boned by the metal wires. In step S5, the substantially entire lead frame 25 is molded with the synthetic resin material. Since the entire lead frame 25 is molded en bloc in step S5, the final shape of the resin mold section 18 is not completed with the synthetic resin material.

In step S6, the lead frame 25 molded with the synthetic resin material is segmented into pieces in a constituent unit of the semiconductor storage device 10 by dicing to manufacture the semiconductor storage devices 10. Thus, the plurality of semiconductor storage devices 10 can be manufactured from one sheet of lead frame. The segmenting of the lead frame into semiconductor storage devices 10 may be performed by dicing, a laser, or the like.

In the semiconductor storage device 10, as described above, the resin mold section 18 in which the semiconductor memory chip 15 and the like are molded forms the outline of the semiconductor storage device 10. Therefore, since a casing accommodating the resin mold section 18 is not necessary, it is possible to reduce the number of constituent elements.

When the lead frame is segmented into the semiconductor storage devices 10 in step S6, the lead portions 19a, 21a, and 22a are cut out so that the plurality of exposed portions 19b, 21b, and 22b is exposed to the outer circumferential surfaces of the resin mold sections 18. Since only one exposed portion 19b, only one exposed portion 21b, and only one exposed portion 22b are formed in the metal plates of the plates 19, 21, and 22, respectively, the exposed portions 19b, 21b, and 22b are electrically insulated from each other inside the resin mold section 18.

Accordingly, for example, when the semiconductor storage device 10 is inserted into the socket of an external apparatus, the plurality of exposed portions 19b, 21b, and 22b comes into contact with conductive portions of the external apparatus. Therefore, even when the contact portions have different potentials, it is possible to prevent short circuit via the plates 19, 21, and 22.

Moreover, when the memory chip plates 21 are disposed in the outer circumference of the bottom surface of the semiconductor memory chip 15, the middle portion of the semiconductor memory chip 15 is filled with the synthetic resin material up to the bottom surface. Accordingly, the resin mold section 18 can be sufficiently filled.

Furthermore, when the terminal plates 19 are fixed by the fixing tape 23, the number of lead portions 19a formed in the terminal plates 19 can be reduced. Since the front end portion of the cut lead portion 19a becomes the exposed portion 19b, the number of lead portions 19a is reduced and the number of exposed portions 19b can thus be reduced. Accordingly, since the exposed portions 19b scarcely come into contact with an external apparatus, short circuit rarely occurs.

Figure 7:
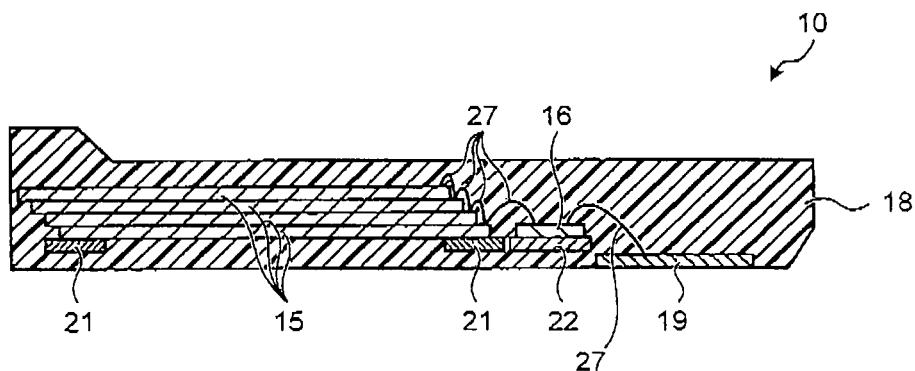
FIG. 7 is a transverse cross sectional view illustrating a semiconductor storage device according a first modified example of the first embodiment.

FIG. 7 is a transverse cross sectional view illustrating the semiconductor storage device 10 according a first modified example of the first embodiment. In the first modified example, as shown in FIG. 7, a plurality of the semiconductor memory chips 15 is laminated on the memory chip plates 21. The plurality of semiconductor memory chips 15 is laminated in a step form to expose the electrode pads formed on the surfaces of the semiconductor memory chips 15. Since the electrode pads formed on the surfaces of the semiconductor memory chips 15 are exposed, wire-bonding can be performed. Thus, it is possible to increase the capacity of the semiconductor storage devices 10 and thus realize higher density by laminating the plurality of semiconductor memory chips 15.

Figure 8:
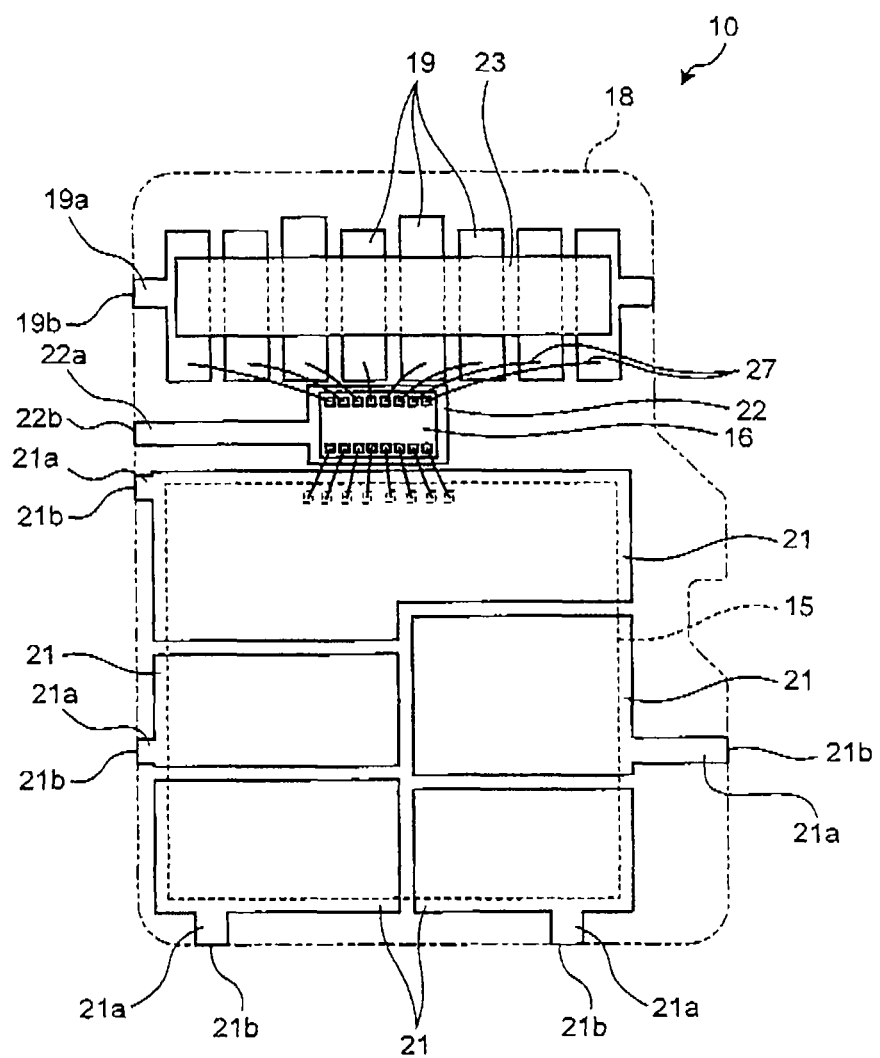
FIG. 8 is a plan view schematically illustrating the inner configuration of a semiconductor storage device according to a second modified example of the first embodiment.

FIG. 8 is a plan view schematically illustrating the inner configuration of the semiconductor storage device 10 according to a second modified example of the first embodiment. In FIG. 8, the semiconductor memory chip 15 is illustrated in a projected view. In the second modified example, the memory chip plates 21 include the plurality of metal plates, as in the above-described embodiment. However, the memory chip plates 21 cover the substantially entire bottom surface of the semiconductor memory chip 15. Thus, since the semiconductor memory chip 15 can be attached more reliably, the mounting strength of the semiconductor memory chip 15 can be improved.

Figure 9:
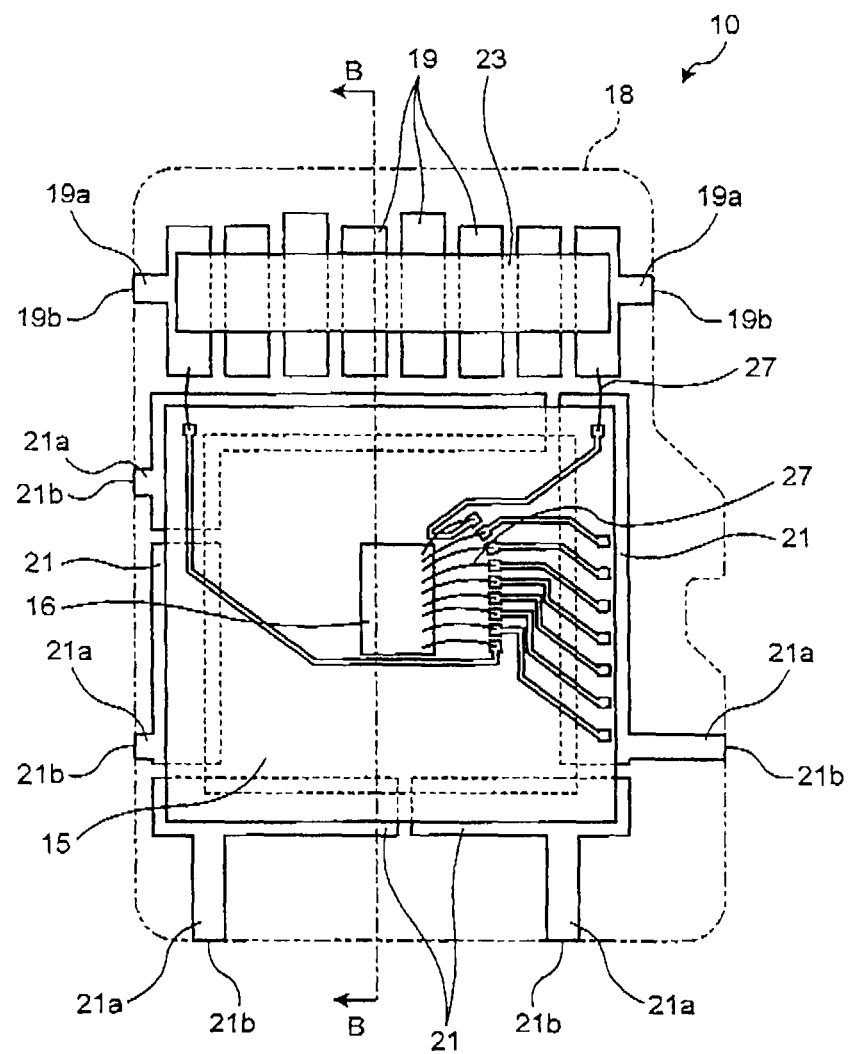
FIG. 9 is a plan view schematically illustrating the inner configuration of a semiconductor storage device according to a third modified example of the first embodiment.
Figure 10:
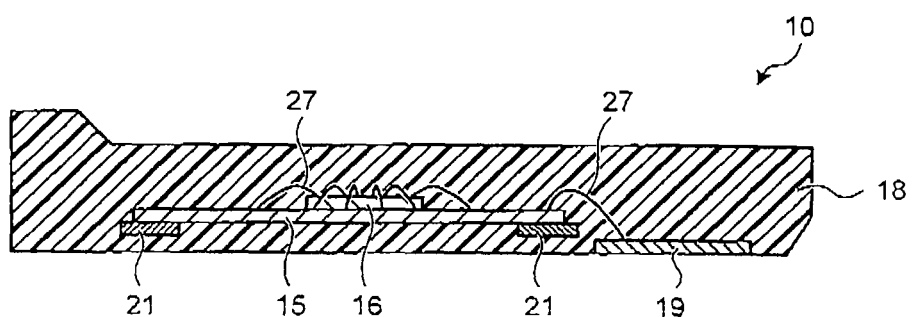
FIG. 10 is a transverse cross sectional view illustrating the cross-section structure of the semiconductor storage device taken along the line B-B of FIG. 9.

FIG. 9 is a plan view schematically illustrating the inner configuration of the semiconductor storage device 10 according to a third modified example of the first embodiment. FIG. 10 is a transverse cross sectional view illustrating the cross-section structure of the semiconductor storage device 10 taken along the line B-B of FIG. 9. In the third modified example, the controller chip 16 is placed on the semiconductor memory chip 15.

Connection wirings connecting the plurality of electrode pads to the plurality of electrode pads are formed on the semiconductor memory chip 15. Some of the electrode pads formed on the semiconductor memory chip 15 are wire-bonded with the terminal plates 19. The electrode pads wire-bonded with the terminal plates 19 and the electrode pads connected to the connection wirings are wire-bonded with the electrode pads formed in the controller chip 16. That is, the controller chip 16 is connected to the terminal plates 19 via the electrode pads and the connection wirings formed on the semiconductor memory chip 15. Likewise, the controller chip 16 and the semiconductor memory chip 15 are connected to each other via the electrode pads and the connection wirings. In FIG. 9, parts of the electrode pads, the connection wirings, and the metal wires 27 are not illustrated.

In the third modified example, since the controller chip 16 is placed on the semiconductor memory chip 15, the space where the controller chip 16 is placed in a plan view is not necessary. Accordingly, although the semiconductor storage device 10 has the same shape in a plan view, the semiconductor memory chip 15 with a larger plane shape can be used. Therefore, the capacity of the semiconductor storage device 10 can increase. Moreover, since it is possible to reduce the space where the controller chip 16 is placed in a plan view, the size of the semiconductor storage device 10 can be reduced.

Figure 11:
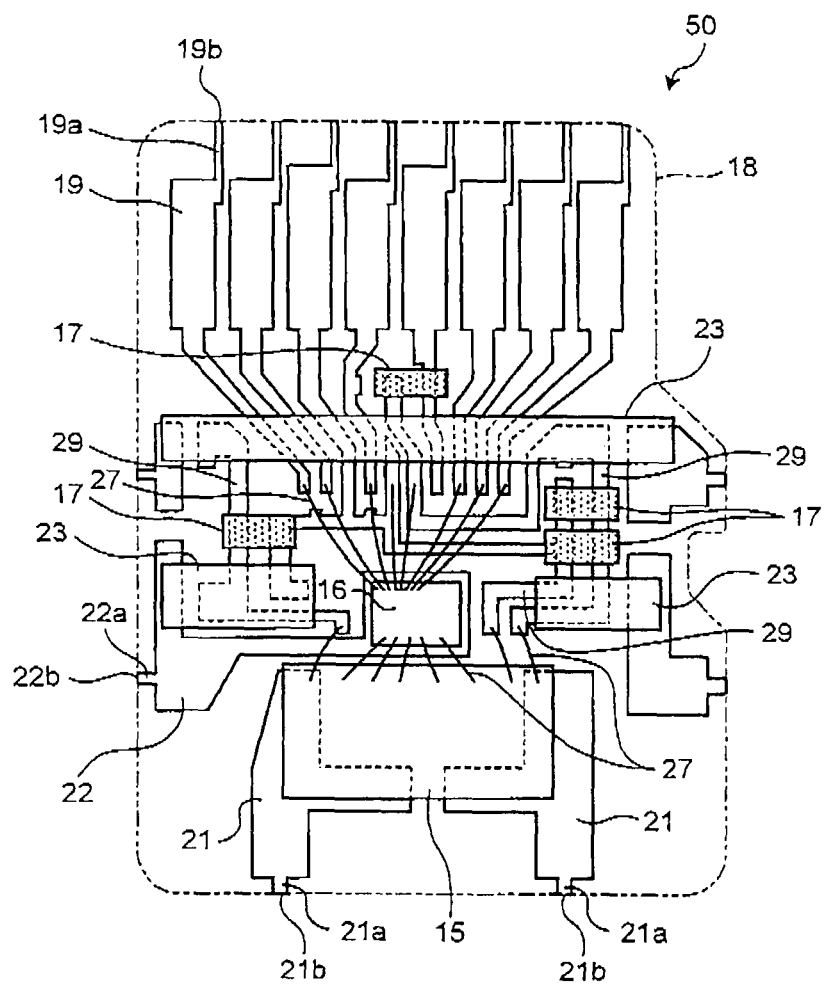
FIG. 11 is a plan view schematically illustrating the inner configuration of a semiconductor storage device according to a second embodiment.

FIG. 11 is a plan view schematically illustrating the inner configuration of a semiconductor storage device according to a third modified example of a second embodiment. The same reference numerals are given to the same constituent elements as those of the above-described embodiment and the description thereof will not be repeated. A semiconductor storage device 50 according to this embodiment includes electronic components 17 and electronic component plates (plate) 29.

The electronic component 17 is a passive component. Examples of the passive component include a capacitor, a resistor, and an inductor. The electronic component plates 29 are used to place the electronic components 17 before the resin mold section 18 is formed. The electronic component plate 29 has no lead portion connected to the frame portion 26 of the lead frame 25 (see FIG. 5). Accordingly, the electronic component plate 29 is positioned and fixed by being connected to another metal plate such as the memory chip plate 21 by the fixing tape 23.

The electronic component 17 is electronically connected to the electronic component plate 29 by soldering. The electronic component plate 29 is wire-bonded with the semiconductor memory chip 15 or the controller chip 16 by the metal wire 27. Accordingly, the electronic component 17 is connected to the semiconductor memory chip 15 or the controller chip 16 via the electronic component plate 29.

Figure 12:
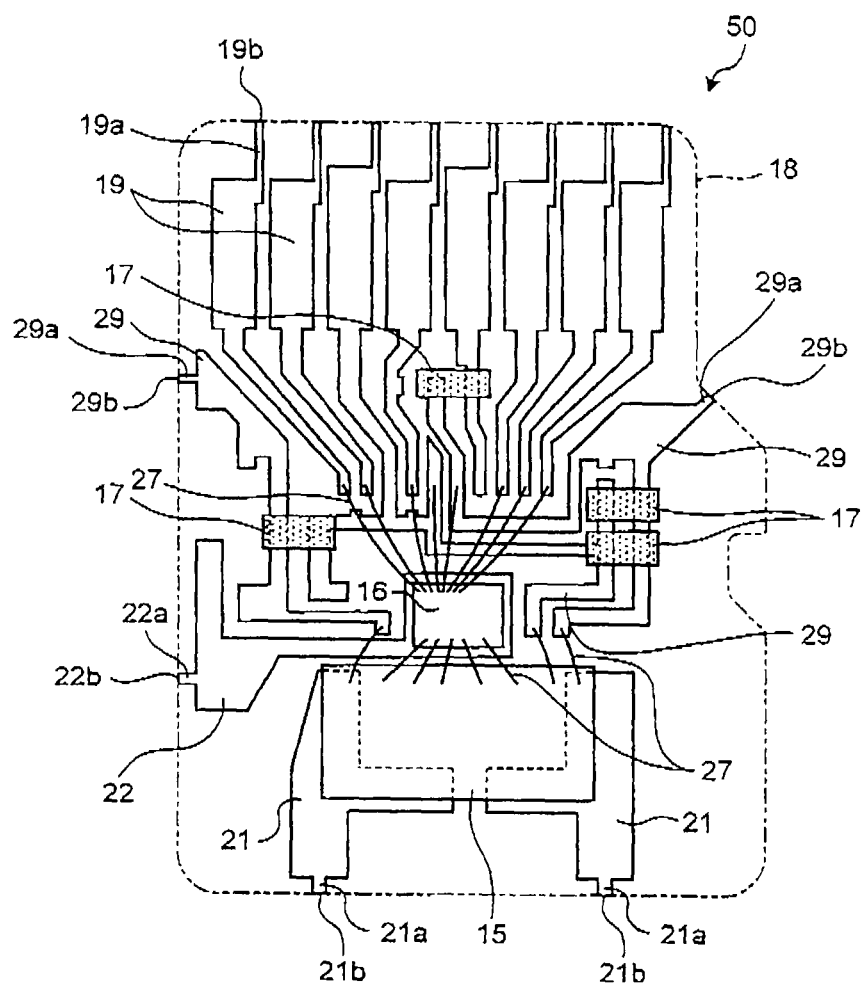
FIG. 12 is a diagram schematically illustrating the inner configuration of a semiconductor storage device according a first modified example of the second embodiment.

FIG. 12 is a diagram schematically illustrating the inner configuration of a semiconductor storage device according a first modified example of the second embodiment. In this modified example, a lead portion 29a is formed in the electronic component plate 29. Accordingly, in the lead frame 25 (see FIG. 5), the component plates 29 can integrally connected to the frame portion 26 via the lead portions 29a. It is not necessary to use the fixing tape positioning and fixing the electronic component plate 29 before the resin mold section 18 is formed. Thus, since the thickness of the resin mold section 18 is less restricted, the semiconductor storage device 50 can be made to be thin. Of course, only one lead portion 29a and only one exposed portion 29b are formed in one electronic component plate 29.

Figure 13:
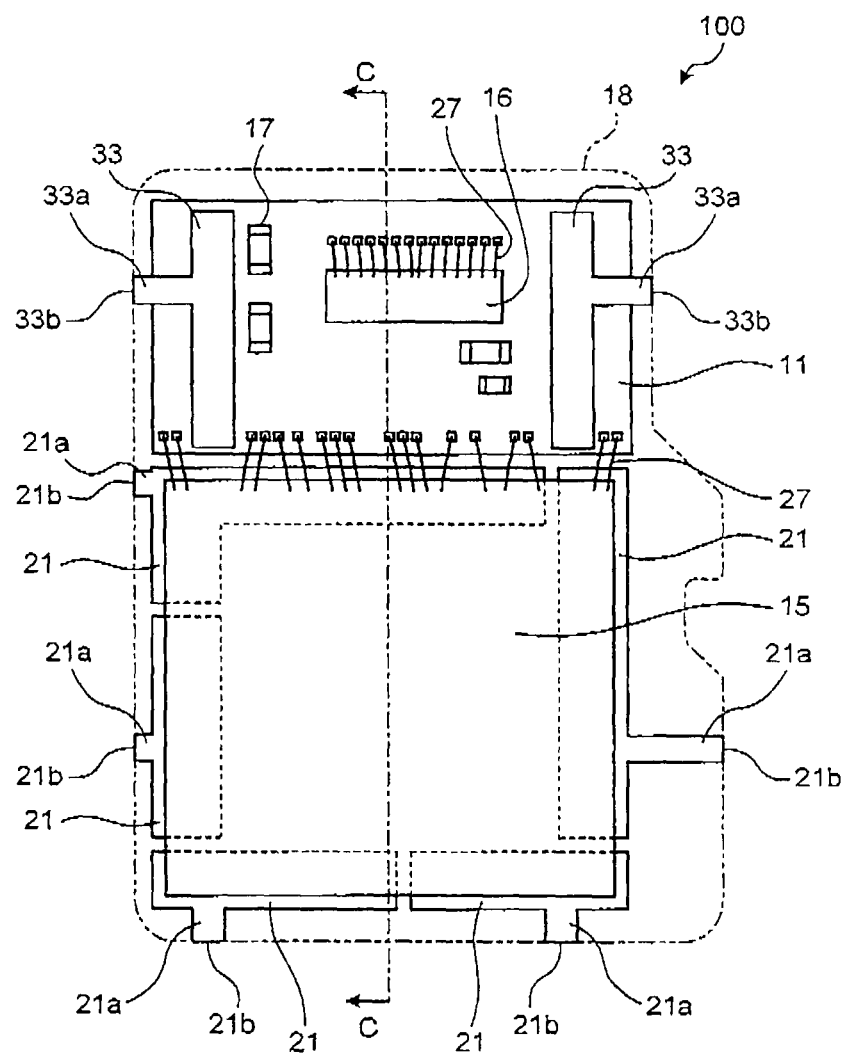
FIG. 13 is a plan view schematically illustrating the inner configuration of a semiconductor storage device according a third embodiment.
Figure 14:
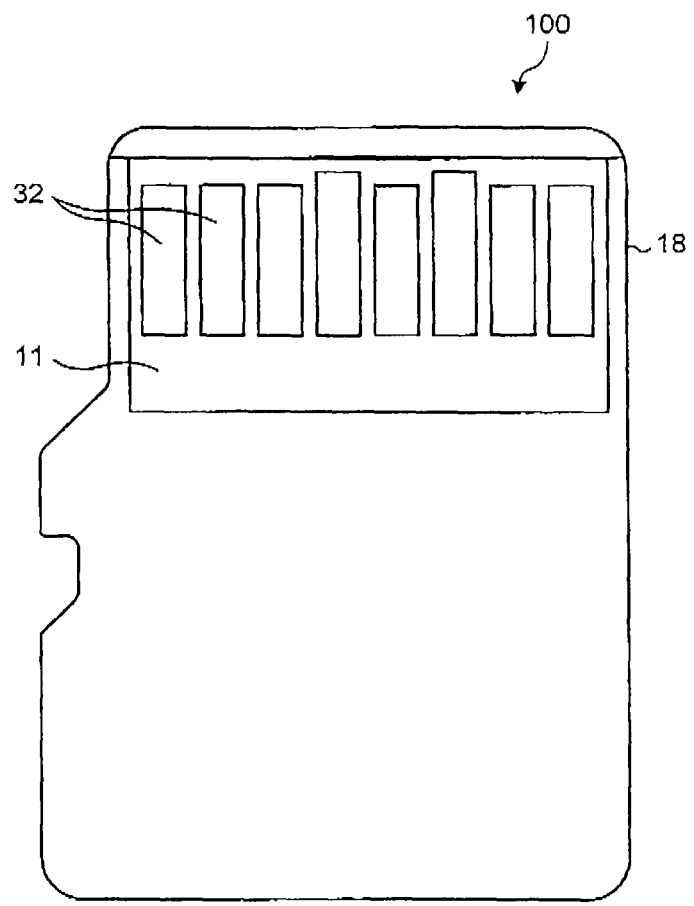
FIG. 14 is a bottom plan view illustrating the semiconductor storage device shown in FIG. 13.
Figure 15:
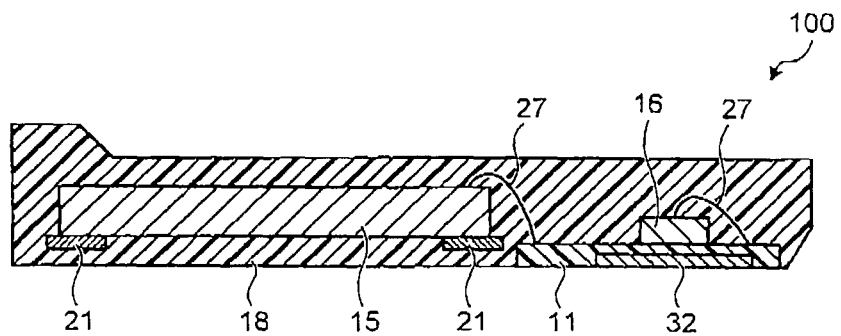
FIG. 15 is a transverse cross sectional view illustrating the cross-section structure of the semiconductor storage device taken along the line C-C of FIG. 13.

FIG. 13 is a plan view schematically illustrating the inner configuration of a semiconductor storage device according a third embodiment. FIG. 14 is a bottom plan view illustrating the semiconductor storage device shown in FIG. 13. FIG. 15 is a transverse cross sectional view illustrating the cross-section structure of the semiconductor storage device taken along the line C-C of FIG. 13. The reference numerals are given to the same constituent elements as those of the above-described embodiments and the description thereof will not be repeated.

A semiconductor storage device 100 includes a resin substrate 11 and substrate plates 33. In the resin substrate 11, a wiring network is formed in the inside of or on the surface of, for example, an insulation resin substrate. The resin substrate 11 functions as both an element-mounted substrate and a terminal-formed substrate. A printed-wiring board using glass-epoxy resin or BT resin (bismaleimide triazine resin) is used as the resin substrate 11. Although not illustrated in detail, the resin substrate 11 has a multi-layered structure and the materials used in the respective layers are different from each other in some cases.

As shown in FIG. 14, terminal metal films (external connection terminal) 32 formed of a metal layer are disposed on the bottom surface of the resin substrate 11. When the semiconductor storage device 100 is inserted into an external apparatus, the terminal metal films 32 function as input/output terminals, that is, external connection terminals of the semiconductor storage device 100.

The upper surface of the resin substrate 11 serves as a mounting surface on which the controller chip 16 or the electronic component 17 is mounted. Therefore, the area of the upper surface of the resin substrate 11 is larger than the area when viewed from the upper surface of the controller chip 16 or the electronic component 17. A plurality of connection pads is formed on the upper surface of the resin substrate 11. The connection pads and the terminal metal films 32 or the connection pads are electrically connected to each other via inner wirings (through holes or the like) of the resin substrate 11.

When the electrode pads formed in the semiconductor memory chip 15 or the controller chip 16 are electrically connected to the connection pads formed in the resin substrate 11 by wire-bonding of the metal wires 27, the elements of the semiconductor memory chip 15, the controller chip 16, the terminal metal films 32, and the like are electrically connected to each other.

The resin substrates 11 are segmented into pieces so that the resin substrate 11 does not nearly overlap with the memory chip plates 21 and the region surrounded by the memory chip plates 21 in a plan view of the inner configuration of the semiconductor storage device 100.

The substrate plates 33 are used to position and fix the resin substrate 11 before the resin mold section 18 is formed. The upper surface of the resin substrate 11 is attached to the substrate plates 33 so as to be positioned and fixed.

The substrate plates 33 include a plurality of metal plates. Moreover, the substrate plates 33 may be formed by one sheet of metal plate. The plurality of metal plates of the substrate plates 33 each has a lead portion 33a extending toward the side surface of the resin mold section 18. A part of the lead portion 33a becomes an exposed portion 33b exposed to the outer circumferential surface of the resin mold section 18. Only one exposed portion 33b is formed in one metal plate of the substrate plate 33.

Next, a process of manufacturing the semiconductor storage device 100 will be described. In this embodiment, a lead frame (not shown) is used in which the memory chip plates 21 and the substrate plates 33 are connected to the frame portion via the lead portions 21a and 33a.

Figure 16:
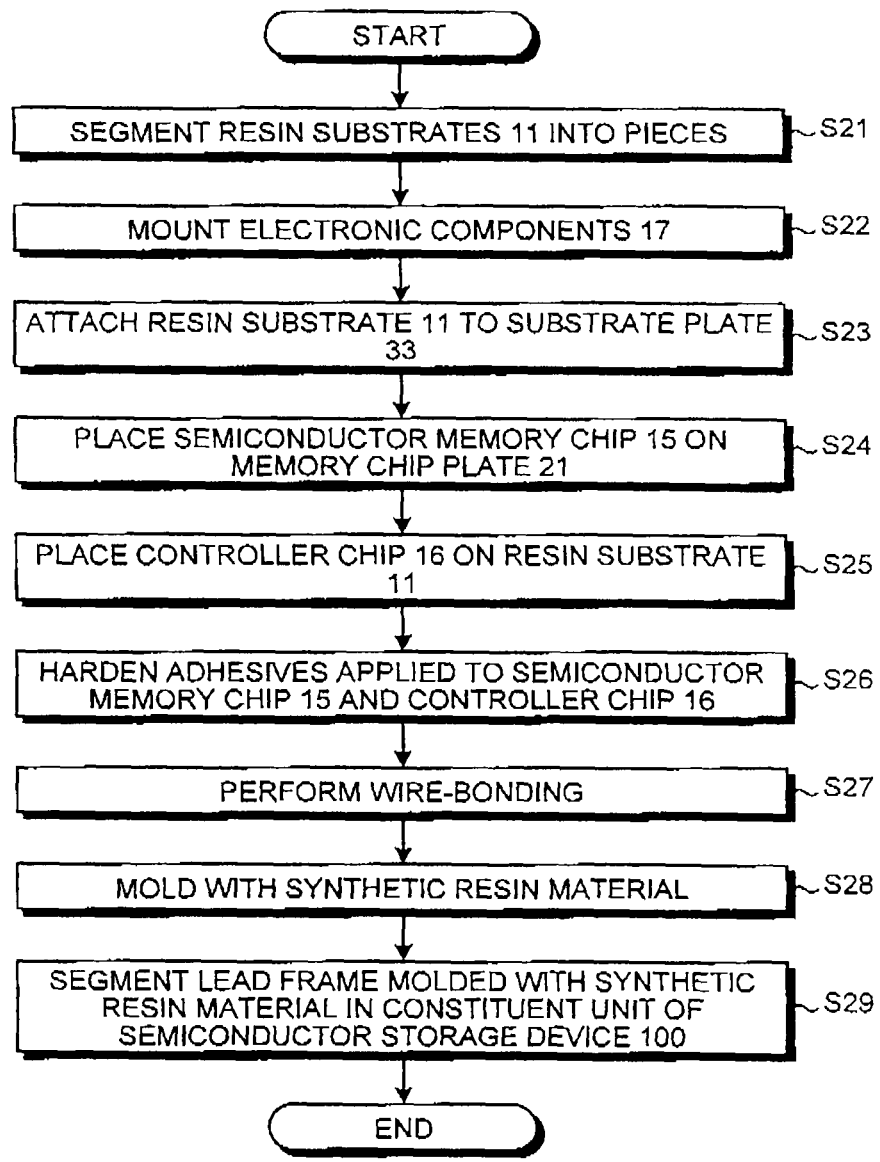
FIG. 16 is a flowchart illustrating a process of the semiconductor storage device.

FIG. 16 is a flowchart illustrating the process of the semiconductor storage device 100. In step 521, the resin substrates 11 are first segmented into pieces. Since the resin substrates 11 are segmented into pieces by a general process using a dicing blade (not shown), the detailed description will not be made. In step S22, the electronic components 17 are mounted on the segmented resin substrate 11. The electronic components 17 are mounted by a reflow process or a flux cleaning process and the detailed description will not be made. Moreover, the order of step S21 and step S22 may be reversed.

In step S23, the resin substrate 11 is attached to the substrate plates 33. In step S24, the semiconductor memory chip 15 applied with an adhesive is placed on the memory chip plate 21 of the lead frame. In step S25, the controller chip 16 applied with an adhesive is placed on the resin substrate 11. In step S26, the adhesives applied to the semiconductor memory 15 and the controller chip 16 are hardened.

In step S27, the electrode pads of the controller chip 16 and the connection pads of the resin substrate 11 are wire-bonded with each other by the metal wires, and the electrode pads of the semiconductor memory chip 15 and the electrode pads of the resin substrate 11 are wire-boned with each other by the metal wires. In step S28, the substantially entire lead frame is molded with the synthetic resin material. In step S29, the lead frame molded with the synthetic resin material is segmented into pieces in a constituent unit of the semiconductor storage device 100 by dicing to manufacture the semiconductor storage devices 100. The segmenting of the lead frame into semiconductor storage devices 100 may be performed by dicing, a laser, or the like.

As described above, the lead frame is segmented into the semiconductor storage devices 100 according to this embodiment so that the resin substrate 11 does not nearly overlap with the memory chip plates 21 in a plan view of the inner configuration of the semiconductor storage devices 100. Accordingly, the resin substrate 11 becomes small in size and the use amount of the resin substrate 11 is thus reduced. Therefore, it is possible to reduce the manufacturing cost of the semiconductor storage devices 100.

When the lead frame is segmented into the semiconductor storage devices 100 in step S29, the lead portions 21a and 33a are cut out and the plurality of exposed portions 21b and 33b is exposed to the outer circumferential surface of the resin mold section 18. Since only one exposed portion 21b and only one exposed portion 33b are formed in the metal plates of the plates 21 and 33, respectively, the exposed portions 21b and 33b are electrically insulated from each other inside the resin mold section 18.

Accordingly, for example, when the semiconductor storage device 100 is inserted into the socket of an external apparatus, the plurality of exposed portions 21b and 33b comes into contact with conductive portions of the external apparatus. Therefore, even when the contact portions have different potentials, it is possible to prevent short circuit via the plates 21 and 33.

Figure 17:
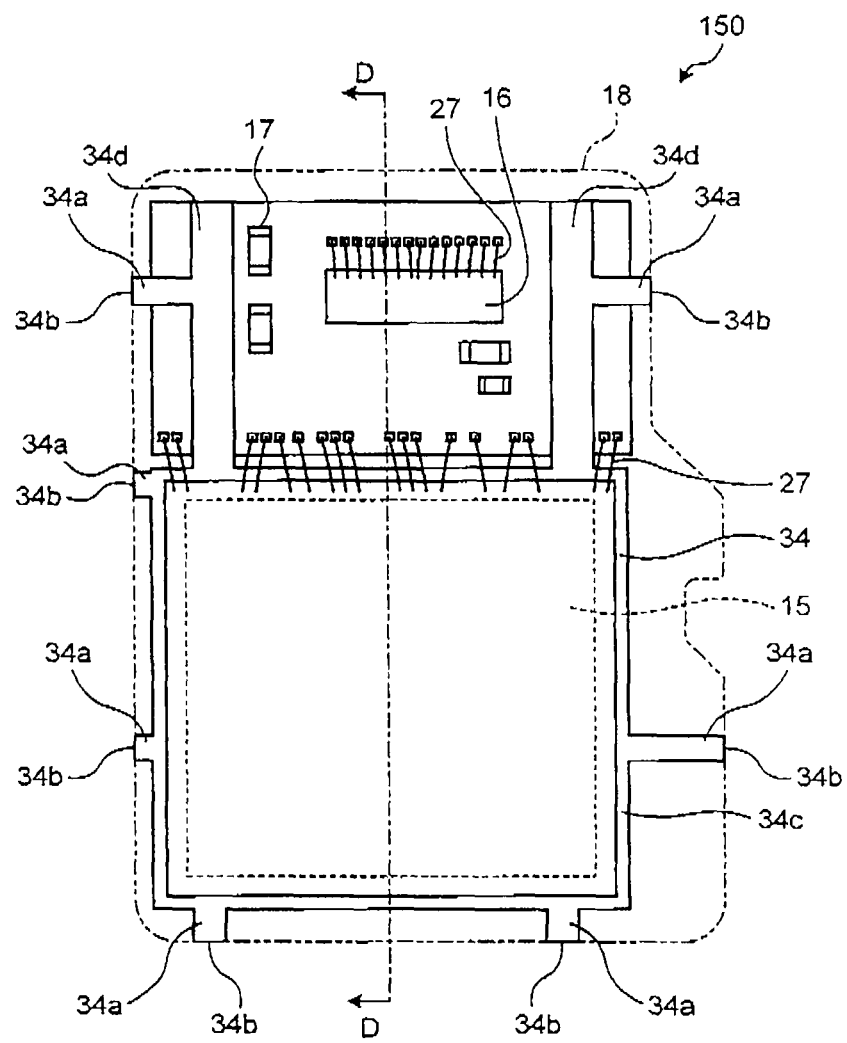
FIG. 17 is a plan view schematically illustrating the inner configuration of a semiconductor storage device according a fourth embodiment.
Figure 18:
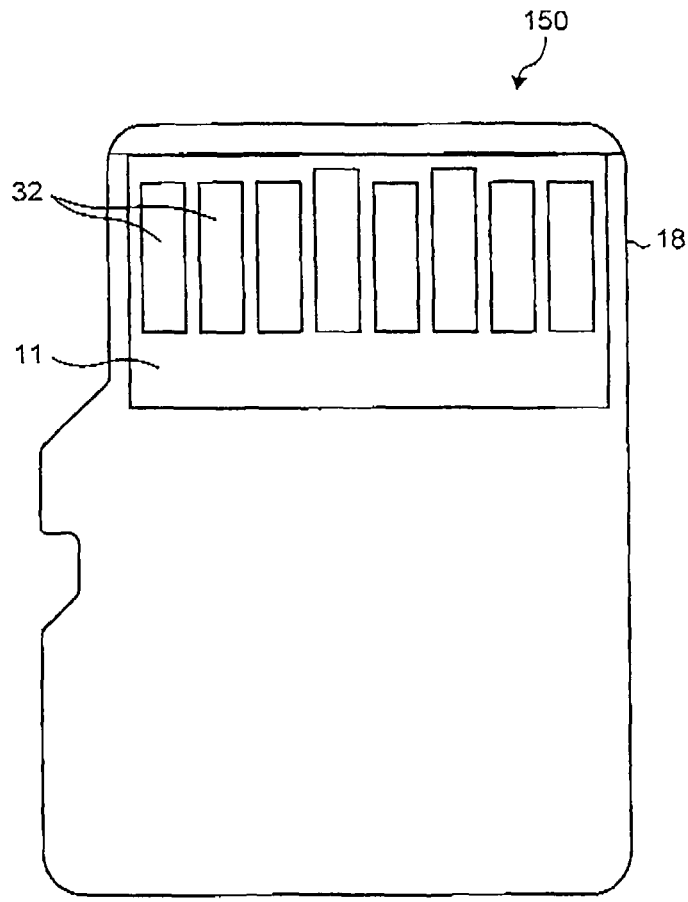
FIG. 18 is a bottom plan view illustrating the semiconductor storage device shown in FIG. 17.
Figure 19:
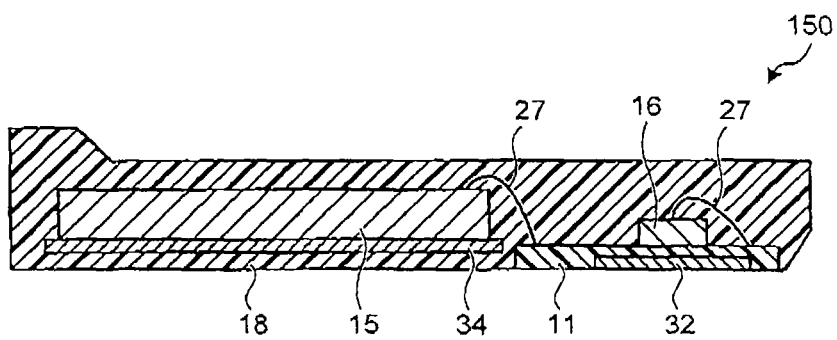
FIG. 19 is a transverse cross sectional view illustrating the cross-section structure of the semiconductor storage device taken along the line D-D of FIG. 17.

FIG. 17 is a plan view schematically illustrating the inner configuration of a semiconductor storage device according a fourth embodiment. FIG. 18 is a bottom plan view illustrating the semiconductor storage device shown in FIG. 17. FIG. 19 is a transverse cross sectional view illustrating the cross-section structure of the semiconductor storage device taken along the line D-D of FIG. 17. In FIG. 17, the semiconductor memory chip 15 is illustrated in a projected view. The same reference numerals are given to the same constituent elements as those of the above-described embodiments and the description thereof will not be repeated.

In a semiconductor storage device 150 according to this embodiment, as in the third embodiment, the controller chip 16 and the electronic components 17 are mounted on the resin substrate 11. The semiconductor storage device 150 includes a resin plate (plate) 34.

The resin plate 34 has the functions of the substrate plate 33 and the memory chip plate 21 (see FIG. 13) described in the third embodiment. More specifically, a memory chip placed portion 34c and substrate-attached portions 34d are integrally formed in the resin plate 34. The semiconductor memory chip 15 is placed on the memory chip placed portion 34c and the resin substrate 11 is attached to the substrate-attached portions 34d.

In the resin plate 34, the memory chip replaced portion 34c and the substrate-attached portions 34d have lead portions 34a extending toward the side surface of the resin mold section 18. A part of the lead portion 34a becomes an exposed portion 34b exposed to the outer circumferential surface of the resin mold section 18. The resin plate 34 is formed of an insulation synthetic resin material.

In this embodiment, since the resin plate 34 is formed of the insulation synthetic resin material, the exposed portions 34b exposed to the outside surface of the resin mold section 18 are electrically insulated from each other. Accordingly, for example, when the semiconductor storage device 150 is inserted into the socket of an external apparatus, the plurality of exposed portions 34b comes into contact with conductive portions of the external apparatus. Therefore, even when the contact portions have different potentials, it is possible to prevent short circuit via the resin plate 34.

In the resin plate 34, the memory chip placed portion 34c and the substrate-attached portions 34d may be integrally formed or may be separately formed. The memory chip placed portion 34c may include a plurality of plates.

Figure 20:
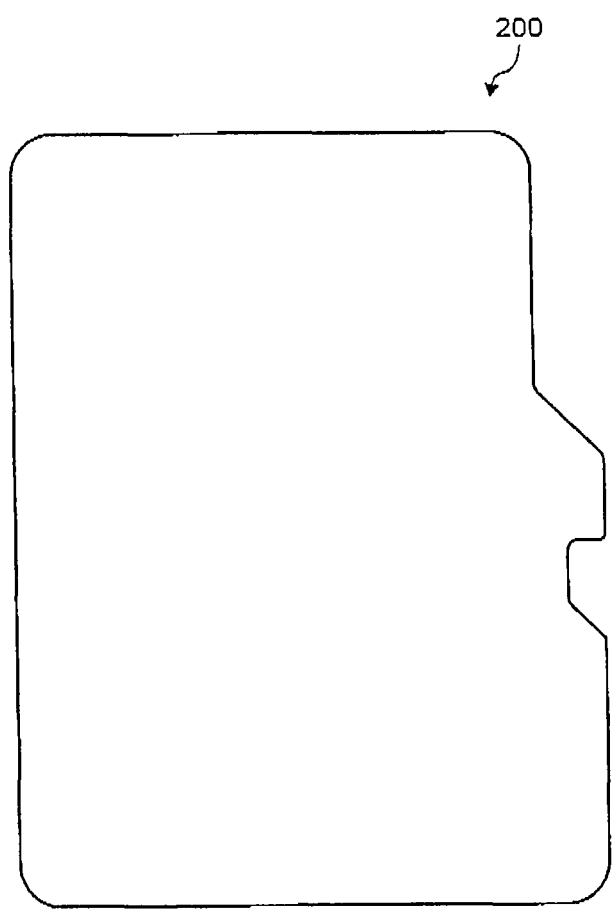
FIG. 20 is a plan view illustrating the outer appearance of a semiconductor storage device according to a fifth embodiment.
Figure 21:
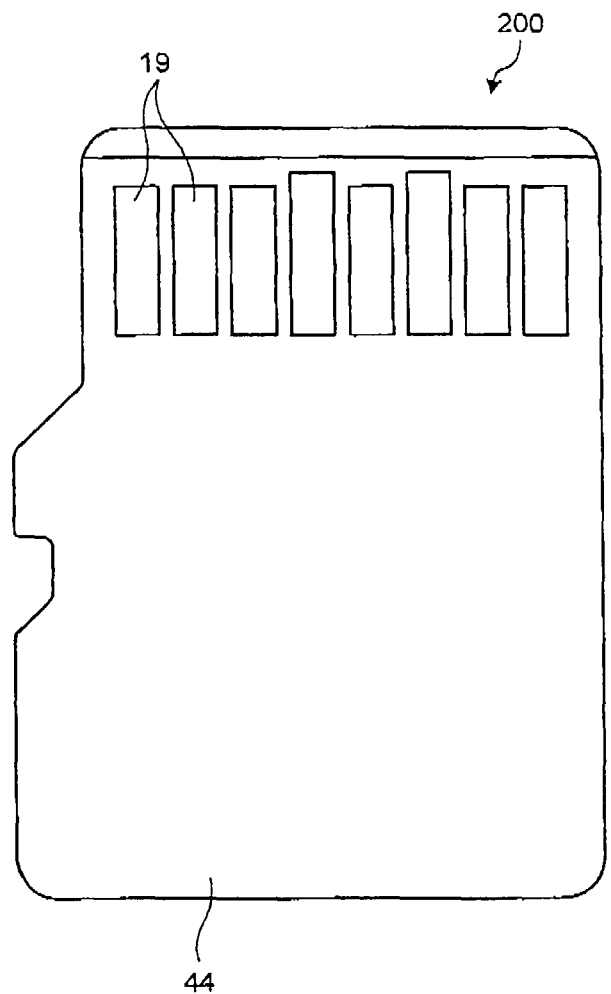
FIG. 21 is a side view illustrating the semiconductor storage device shown in FIG. 20.
Figure 22:
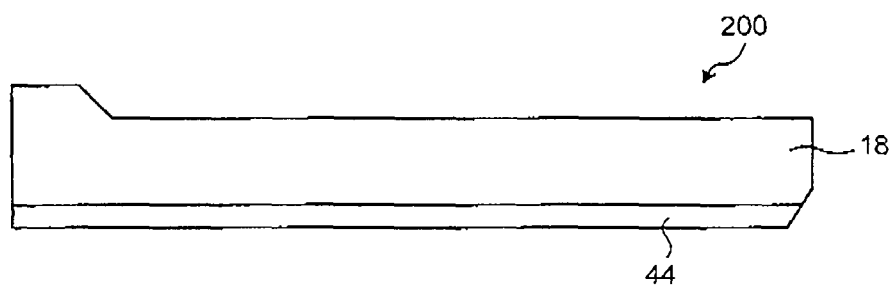
FIG. 22 is a bottom plan view illustrating the outer appearance of the semiconductor storage device shown in FIG. 20.
Figure 23:
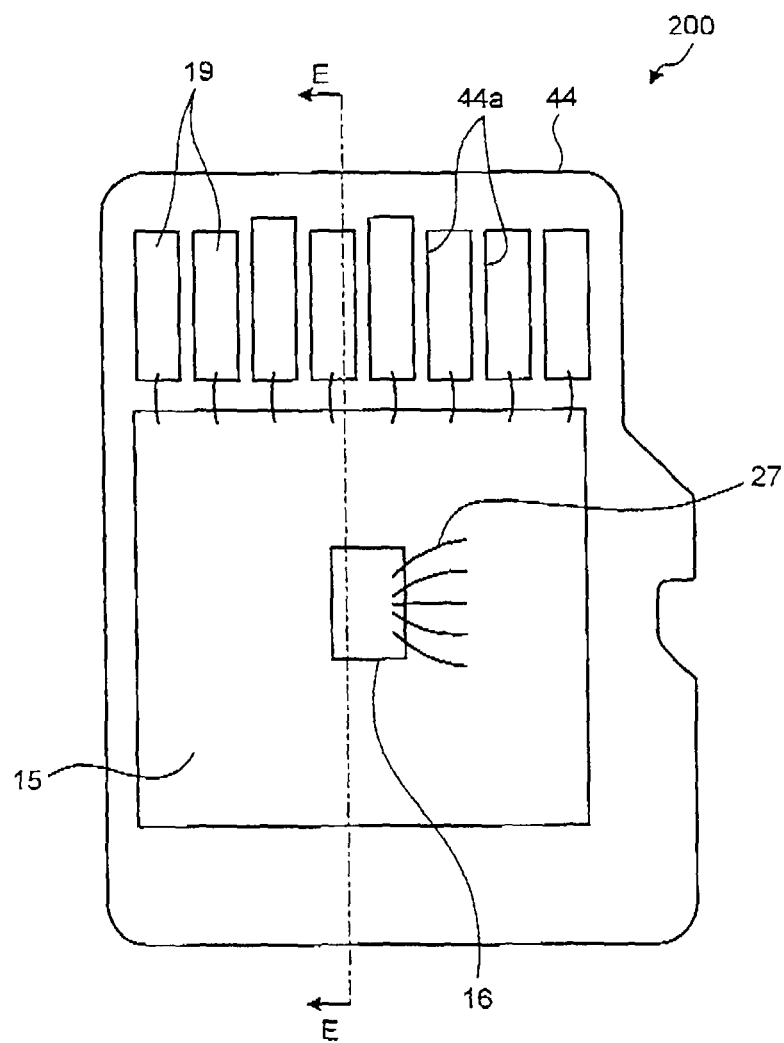
FIG. 23 is a diagram schematically illustrating the inner configuration of the semiconductor storage device shown in FIG. 20.
Figure 24:
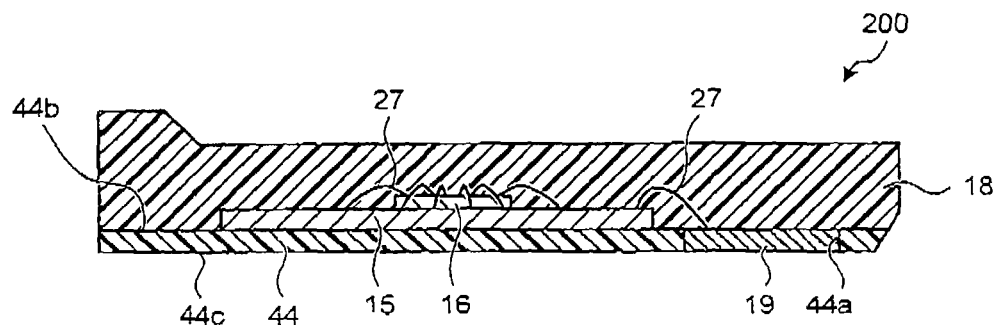
FIG. 24 is a transverse cross sectional view illustrating the cross-section structure of the semiconductor storage device taken along the line E-E of FIG. 23.

FIG. 20 is a plan view illustrating the outer appearance of a semiconductor storage device according to a fifth embodiment. FIG. 21 is a side view illustrating the semiconductor storage device shown in FIG. 20. FIG. 22 is a bottom plan view illustrating the outer appearance of the semiconductor storage device shown in FIG. 20. FIG. 23 is a diagram schematically illustrating the inner configuration of the semiconductor storage device shown in FIG. 20. FIG. 24 is a transverse cross sectional view illustrating the cross-section structure of the semiconductor storage device taken along the line E-E of FIG. 23. The same reference numerals are given to the same constituent elements as those of the above-described embodiments and the description thereof will not be repeated.

A semiconductor storage device 200 includes the semiconductor memory chip 15 and a basic plate (plate) 44 positioning and fixing the terminal plates 19. The basic plate 44 has substantially the same shape as the plane shape of the semiconductor storage device 200. In this embodiment, the resin mold section 18 is installed so as to cover an upper surface 44b of the basic plate 44. That is, in this embodiment, a surface other than the upper surface 44b of the basic plate 44 becomes one exposed portion exposed to the outer circumferential surface of the semiconductor storage device 200. The basic plate 44 is formed of an insulation material. Since the basic plate 44 is formed relatively thin, an insulation material such as glass-epoxy resin, polyimide resin, or rubber is preferably used in order to prevent cracking from occurring during handling.

In the basic plate 44, fitting-in openings 44a having substantially the same shape as the plane shape of the terminal plate 19 are formed at the installed positions of the terminal plates 19. The fitting-in opening 44a is formed as a through hole vertically perforated through the basic plate 44. The terminal plate 19 fits in the fitting-in opening 44a so as to be positioned and fixed and is exposed from the bottom surface of the semiconductor storage device 200 to function as an external connection terminal.

The semiconductor memory chip 15 is placed on the basic plate 44. The controller chip 16 is placed on the semiconductor memory chip 15. As in the third modified example of the above-described first embodiment, electrode pads and the connection wirings are formed on the semiconductor memory chip 15. Therefore, the controller chip 16 is connected to the terminal plates 19 via the electrode pads and the connection wirings formed on the semiconductor memory chip 15. Likewise, the controller chip 16 and the semiconductor memory chip 15 are connected to each other via the electrode pads and the connection wirings.

Figure 25:
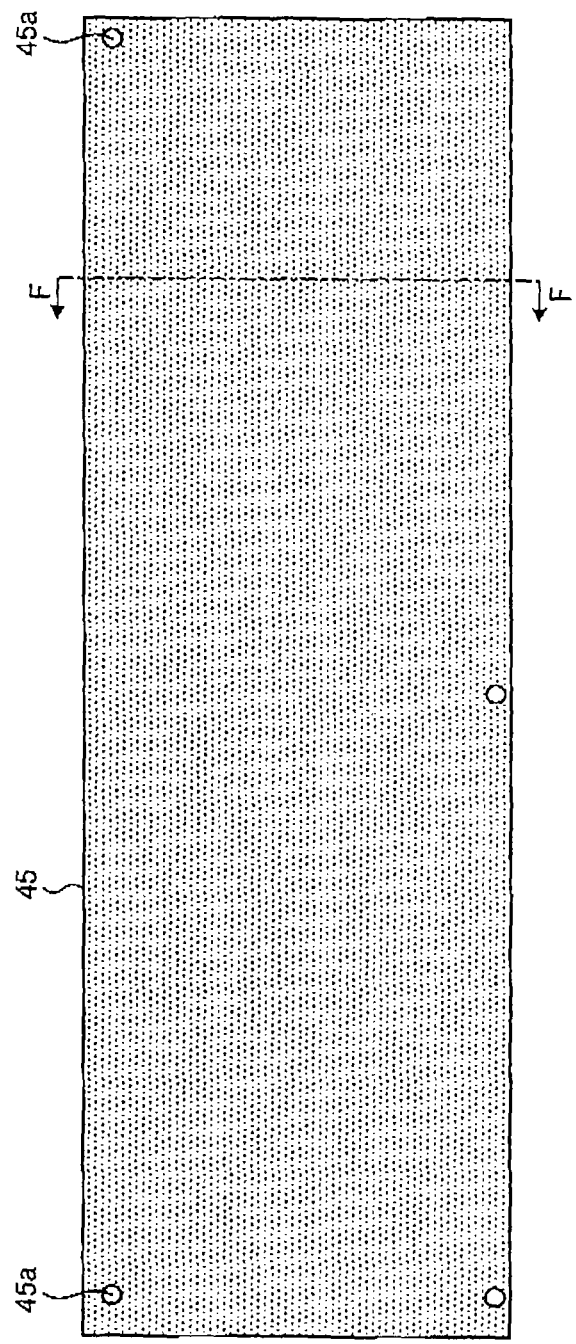
FIG. 25 is a plan view illustrating a sheet before a basic plate is segmented.
Figure 26:
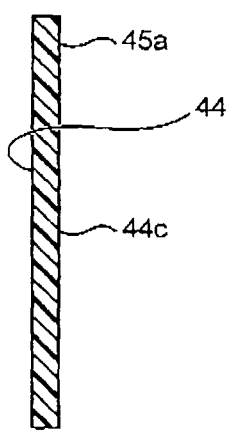
FIG. 26 is a cross-sectional view taken along the line F-F of FIG. 25.

Next, a process of manufacturing the semiconductor storage device 200 will be described. FIG. 25 is a plan view illustrating a sheet before the sheet is segmented into the basic plates 44. FIG. 26 is a cross-sectional view taken along the line F-F of FIG. 25. The sheet 45 has a size to the degree of forming the plurality of basic plates 44 from one sheet. As shown in FIG. 25, positioning holes 45a are formed to easily position the sheet 45 in the subsequent processes. The semiconductor storage devices 200 are manufactured by performing the subsequent processes on the sheet 45.

Figure 27:
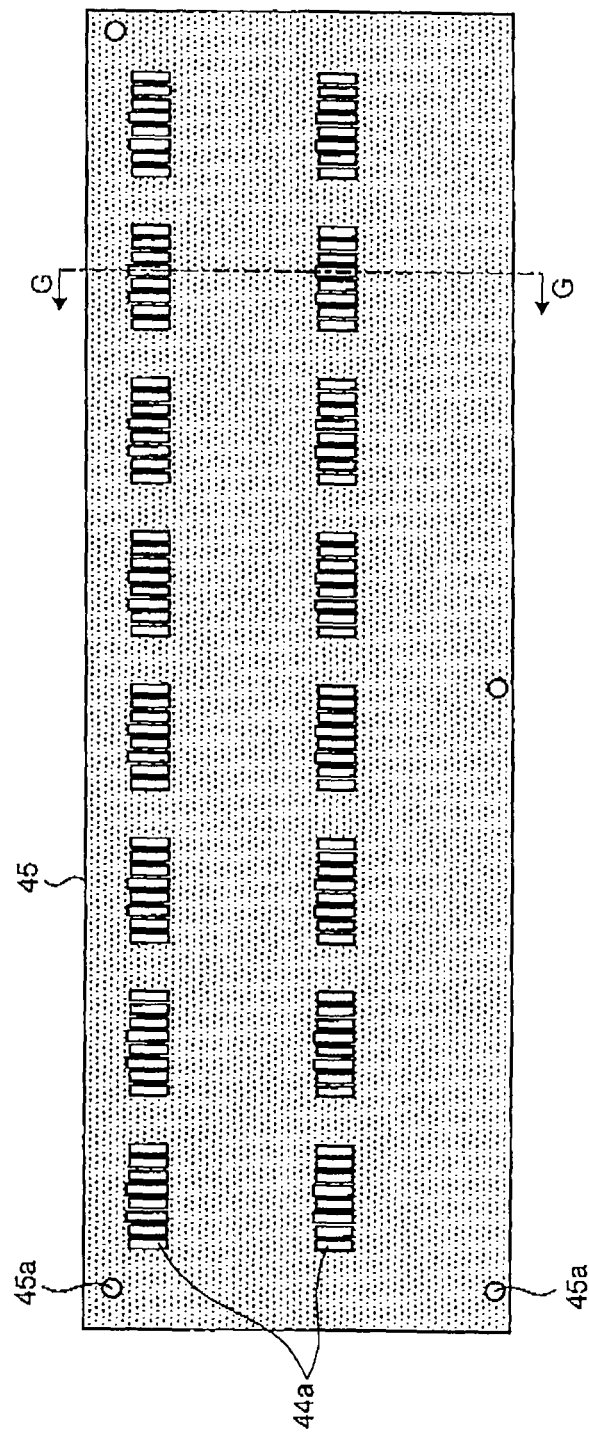
FIG. 27 is a plan view illustrating the sheet in which fitting-in openings are formed.
Figure 28:
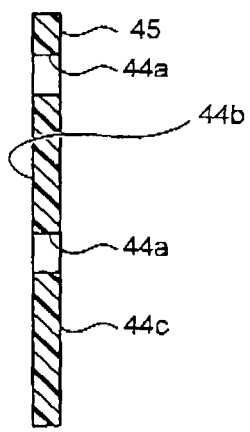
FIG. 28 is a cross-sectional view taken along the line G-G of FIG. 27.
Figure 29:
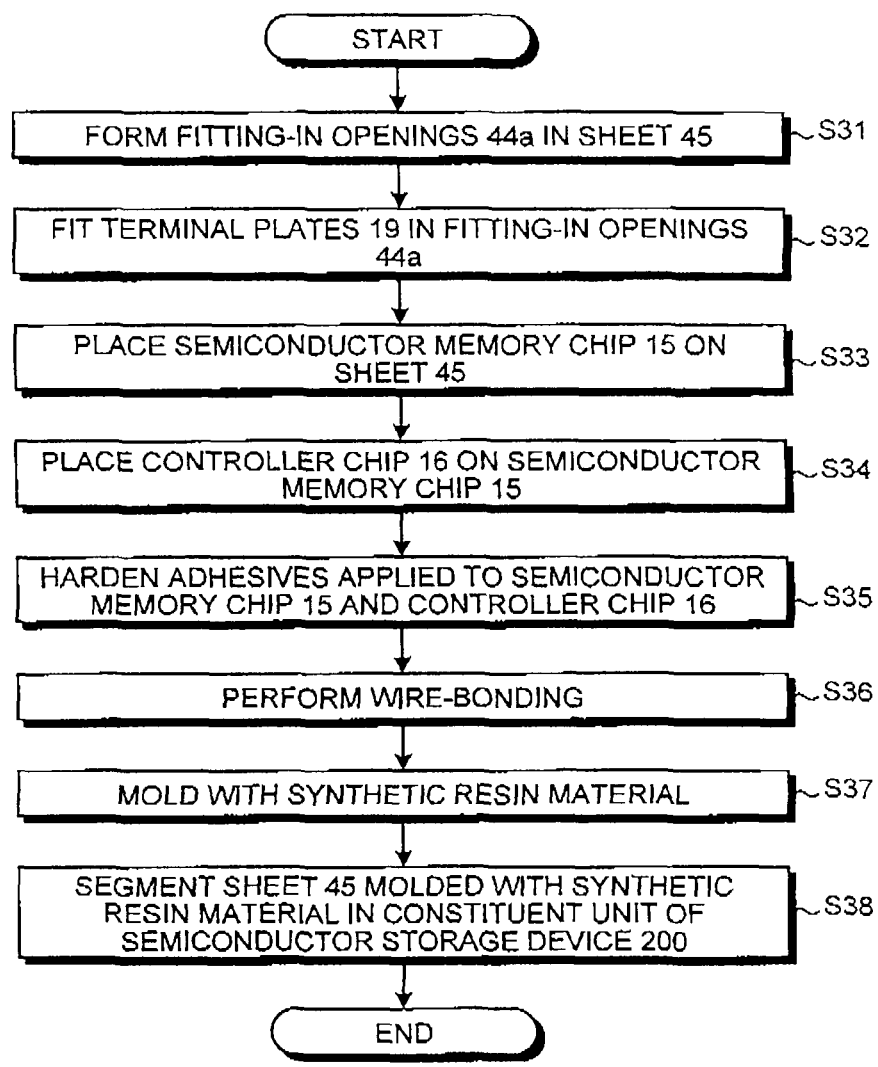
FIG. 29 is a flowchart illustrating a process of manufacturing a semiconductor storage device.

FIG. 27 is a plan view illustrating the sheet 45 in which fitting-in openings 44a are formed. FIG. 28 is a cross-sectional view taken along the line G-G of FIG. 27. FIG. 29 is a flowchart illustrating a process of manufacturing the semiconductor storage device 200. In step S31, the fitting-in openings 44a are first formed in the sheet 45, as shown in FIG. 27. The fitting-in openings 44a are formed by, for example, punching. Moreover, the sheet 45 may be formed so that the fitting-in openings 44a are initially formed. Specifically, the sheet 45 in which the fitting-in openings 44a are initially formed can be formed by filling a mold having pieces at the positions of the fitting-in openings 44a with an insulation material such as epoxy resin.

Figure 30:
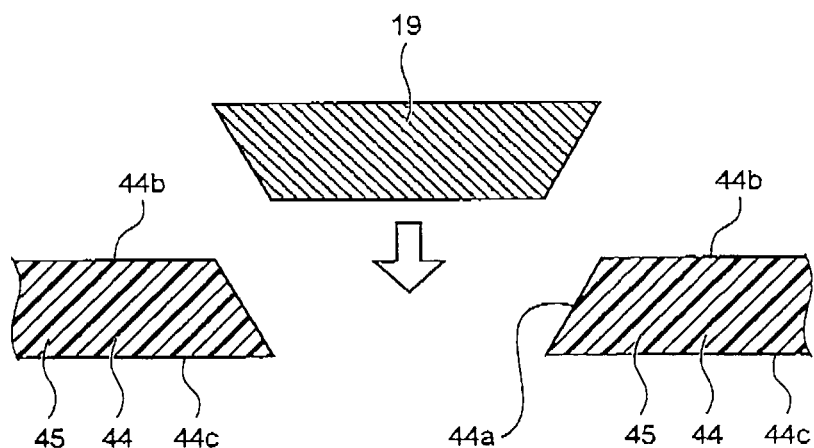
FIG. 30 is an expanded view illustrating the fitting-in opening.

In step S32, the terminal plates 19 fit in the fitting-in openings 44a, respectively. FIG. 30 is an expanded view illustrating the fitting-in opening 44a. As shown in FIG. 30, the fitting-in opening 44a has a tapered shape in which an opening area is gradually narrowed from the front side of an insertion direction of the terminal plate 19 to the rear side (toward the outer circumferential surface of the semiconductor storage device 200). Similarly, the terminal plate 19 also has a tapered shape in which a cross-section area is gradually narrowed from the front side of the insertion direction to the rear side (toward the outer circumferential surface of the semiconductor storage device 200). The tapered portion of the fitting-in opening 44a comes into contact with the tapered portion of the terminal plate 19. Thus, the terminal plate 19 can be prevented from falling from the side of the upper surface 44b to the side of the bottom surface 44c by attaching the terminal plate 19 to the fitting-in opening 44a. Moreover, the fitting-in opening 44a and the terminal plate 19 may have no tapered portion. The terminal plate 19 may be configured so as to be prevented from falling by forming the terminal plate 19 and the fitting-in opening 44a with high accuracy so that the terminal plate 19 appropriately fits in the fitting-in opening 44a. Moreover, even when there is a gap between the terminal plate 19 and the fitting-in opening 44a, the gap may be filled with a synthetic resin material in the step of forming the resin mold section 18. Then, the terminal plate 19 can be prevented from falling.

In step S33, the semiconductor memory chip 15 applied with an adhesive is placed at a predetermined position on the sheet 45. In step S34, the controller chip 16 applied with an adhesive is placed at a predetermined position on the semiconductor memory chip 15. In step S35, the adhesives applied to the semiconductor memory 15 and the controller chip 16 are hardened.

In step S36, the electrode pads of the semiconductor memory chip 15 and the terminal plates 19 are wire-bonded with each other by the metal wires, and the electrode pads of the controller chip 16 and the electrode pads of the semiconductor memory chip 15 are wire-bonded with each other by the metal wires. In step S37, the substantially entire sheet 45 is molded with the synthetic resin material. Since the entire sheet 45 is molded en bloc in step S37, the final shape of the resin mold section 18 is not completed with the synthetic resin material.

In step S38, the sheet 45 molded with the synthetic resin material is segmented into pieces in a constituent unit of the semiconductor storage device 200 by dicing to manufacture the semiconductor storage devices 200. When the sheet 45 is segmented into the semiconductor storage devices 200 by dicing, each basic plate 44 is cut out so as to have substantially the same shape as the plane shape of the semiconductor storage device 200. Thus, the plurality of semiconductor storage devices 200 can be manufactured from one sheet 45. The segmenting of the lead frame into semiconductor storage devices 200 may be performed by dicing, a laser, or the like.

In the semiconductor storage device 200, as described above, the resin mold section 18 and the basic plate 44 in which the semiconductor memory chip 15 and the like are molded forms the outline of the semiconductor storage device 200. Therefore, since a casing accommodating the resin mold section 18 is not necessary, it is possible to reduce the number of constituent elements.

Moreover, the basic plate 44 is formed of the insulation material. Accordingly, even when the exposed portions other than the upper surface 44b come into contact with conductive portions of an external apparatus and the contact portions have different potentials, it is possible to prevent short circuit via the basic plate 44.

Moreover, step S33 of placing the semiconductor memory chip 15 and step S34 of placing the controller chip 16 may be reversely performed. When it is necessary to mount a passive component such as a capacitor, it is desirable that the component is mounted before the mounting of the semiconductor memory chip 15 and the controller chip. 16 and a reflow process or a flux cleaning process is terminated.

Figure 31:
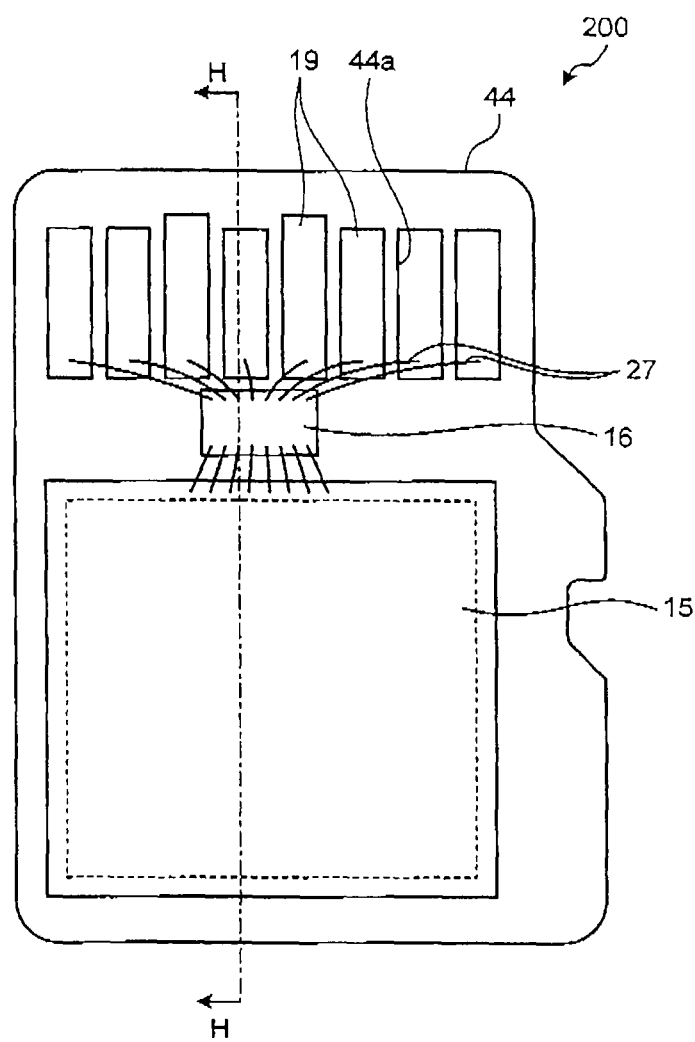
FIG. 31 is a plan view schematically illustrating the inner configuration of the semiconductor storage device according to a first modified example of the fifth embodiment.
Figure 32:
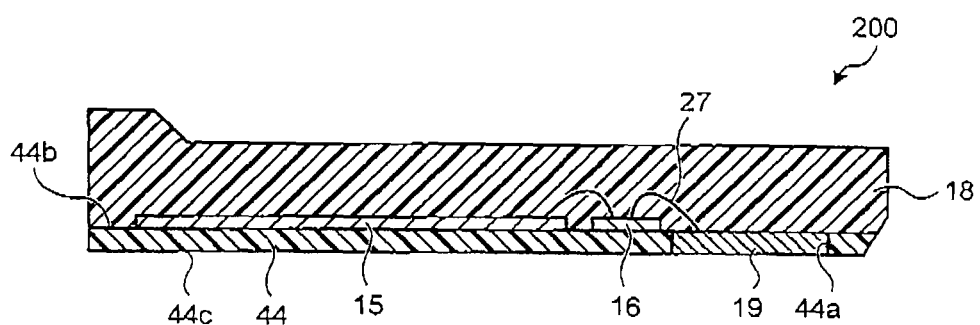
FIG. 32 is a cross-sectional view taken along the line H-H of FIG. 31.

FIG. 31 is a plan view schematically illustrating the inner configuration of the semiconductor storage device 200 according to a first modified example of the fifth embodiment. FIG. 32 is a cross-sectional view taken along the line H-H of FIG. 31. In this modified example, the controller chip 16 is placed on the basic plate 44. Accordingly, the terminal plates 19 are wire-bonded with the electrode pads of the controller 16 by the metal wires 27 and the electrode pads of the controller chip 16 are wire-bonded with the electrode pads of the semiconductor memory chip 15 by the metal wires 27.

Figure 33:
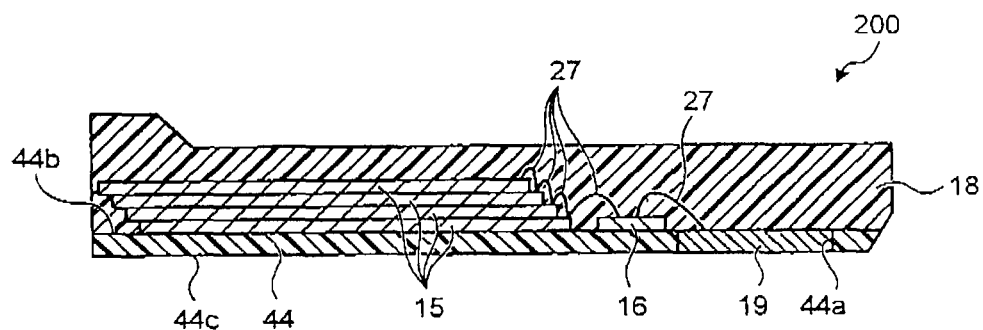
FIG. 33 is a transverse plan view schematically illustrating the inner configuration of the semiconductor storage device according to a second modified example of the fifth embodiment.

FIG. 33 is a transverse plan view schematically illustrating the inner configuration of the semiconductor storage device 200 according to a second modified example of the fifth embodiment. In this embodiment, as shown in FIG. 33, a plurality of the semiconductor memory chips 15 is laminated on the basic plate 44. The plurality of semiconductor memory chips 15 is laminated in a step form to expose the electrode pads formed on the surfaces of the semiconductor memory chips 15. Since the electrode pads formed on the surfaces of the semiconductor memory chips 15 are exposed, wire-bonding can be performed. Thus, it is possible to increase the capacity of the semiconductor storage device 200 and thus realize higher density by laminating the plurality of semiconductor memory chips 15.

Figure 34:
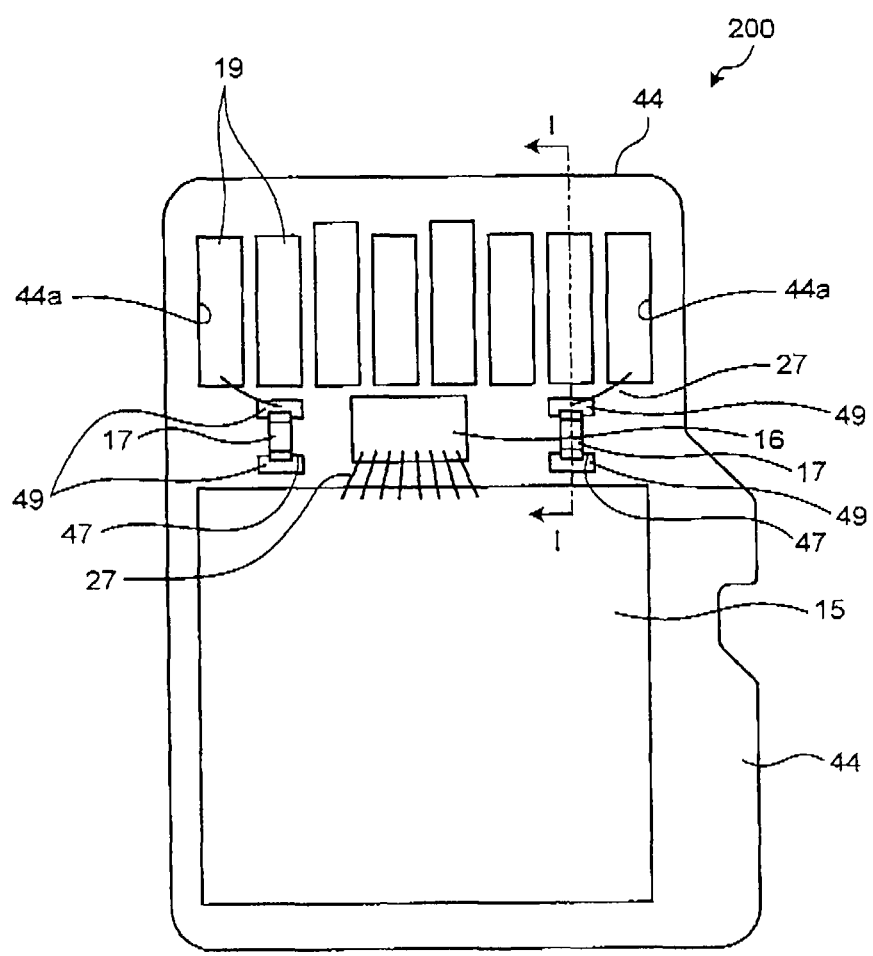
FIG. 34 is a plan view schematically illustrating the inner configuration of the semiconductor storage device according to a third modified example of the fifth embodiment.
Figure 35:
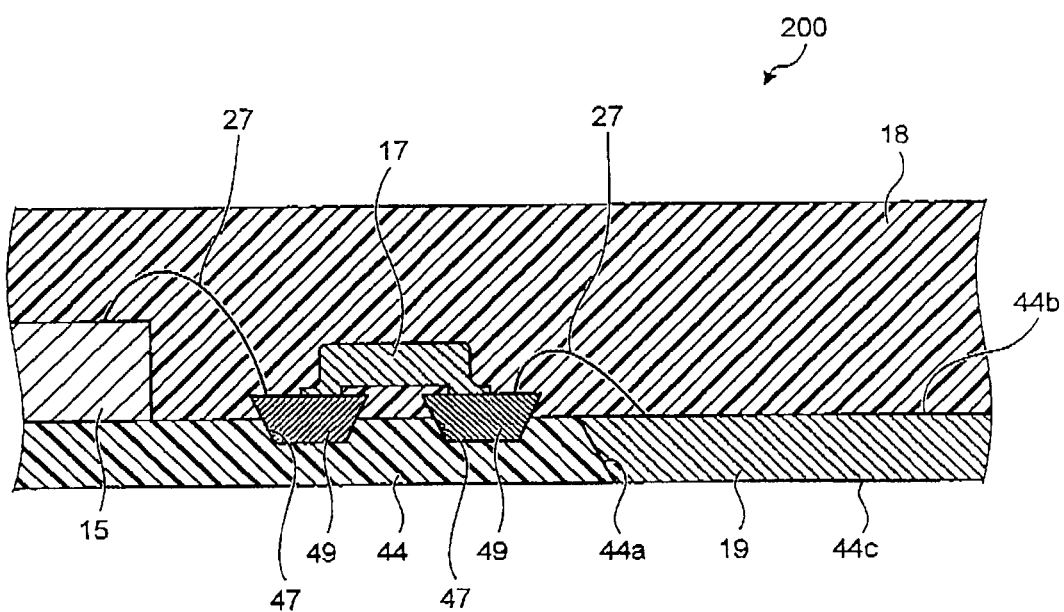
FIG. 35 is a cross-sectional view taken along the line I-I of FIG. 34.

FIG. 34 is a plan view schematically illustrating the inner configuration of the semiconductor storage device 200 according to a third modified example of the fifth embodiment. FIG. 35 is a cross-sectional view taken along the line I-I of FIG. 34. In this modified example, the semiconductor storage device 200 includes the electronic component 17.

The electronic component 17 is mounted on the basic plate 44. As shown in FIG. 35, concave portions 47 are formed in the upper surface 44b of the basic plate 44. The concave portions 47 are not perforated through the basic plate 44 differently from the fitting-in opening 44a. Electronic component plates 49 fit in the concave portions 47, respectively. The electronic component plate 49 is formed of a conductive material such as metal.

Connection terminals of the electronic component 17 are respectively fixed to the electronic component plates 49 fitting in the concave portions 47 by soldering. The electronic component plate 49 is wire-bonded with the electrode pad of the semiconductor memory chip 15 or the terminal plate 19 by the metal wire 27.

Thus, even when the basic plate 44 with no wiring layer is used, the electronic component 17 can be electrically connected to the terminal plate 19 or the semiconductor memory chip 15 via the electronic component plates 49 fitting in the concave portions 47. Accordingly, it is possible to obtain the semiconductor storage device 200 including the electronic component 17.

When the electronic component 17 is mounted earlier than the semiconductor memory chip 15 or the controller chip 16, the semiconductor memory chip 15 or the controller chip 16 not mounted does not receive any influence of a defect occurring in the step of mounting the electronic component 17. Accordingly, it is possible to prevent wasting and uselessness.

The invention is not limited to the configuration in which the electronic component plate 49 fits in the concave portion 47. Instead, the electronic component plate 49 may be attached on the upper surface 44b of the basic plate 44.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the sprit of the inventions. The accompanying claims and their equivalents are intended to cover such forms or modifications as would fall within the scope and spirit of the inventions.

What is claimed is:

1. A semiconductor storage device in which a semiconductor memory chip is molded in a resin mold section, comprising:
   a plate that includes a first surface and a second surface, both of the first and second surfaces being molded in the resin mold section, and the semiconductor memory chip being placed on the first surface; and
   an external connection terminal which is exposed to an outer circumferential surface of the semiconductor storage device,
   wherein the plate has a plurality of exposed portions exposed to an outer circumference surface of the resin mold section, and
   wherein the plurality of exposed portions at a side edge of the first and second surfaces are electrically insulated from each other inside the resin mold section.

2. The semiconductor storage device according to claim 1, wherein the plate is divided into a plurality of plates inside the resin mold section and each of the divided plates has one exposed portion exposed from the resin mold section.

3. The semiconductor storage device according to claim 1, wherein the external connection terminal and the exposed portion are electrically insulated from each other inside the resin mold section.

4. The semiconductor storage device according to claim 1, wherein the plate is formed of an insulation material.

5. The semiconductor storage device according to claim 1, wherein the plate comes into contact with an outer circumference other than a middle region of a bottom surface of the semiconductor memory chip.

6. The semiconductor storage device according to claim 1, wherein the plate comes into contact with the substantially entire bottom surface of the semiconductor memory chip.

7. The semiconductor storage device according to claim 1, wherein the external connection terminal includes a plurality of arranged metal plates, and
wherein the semiconductor storage device further comprises a fixing tape that connects and fixes the plurality of metal plates to each other.

8. The semiconductor storage device according to claim 1, wherein a plurality of the semiconductor memory chips are laminated on the plate.

9. The semiconductor storage device according to claim 1, further comprising:
   a controller chip that writes or reads data into or from the semiconductor memory chip,
   wherein the controller chip is placed on the semiconductor memory chip.

10. The semiconductor storage device according to claim 1, further comprising:
    a plurality of electronic component plates on which electronic components molded in the resin mold section are placed.

11. The semiconductor storage device according to claim 10, further comprising:
    a fixing tape that connects and fixes the electronic component plates to each other.

12. The semiconductor storage device according to claim 1, further comprising:
    a resin substrate of which one surface is exposed from the resin mold section,
    wherein the external connection terminal is installed in the one surface of the resin substrate.

13. The semiconductor storage device according to claim 12, further comprising:
    a controller chip that writes or reads data into or from the semiconductor memory chip,
    wherein the resin substrate has a shape in which a region which does not overlap with the controller chip in a plan view is larger than a region which overlaps with the controller chip.

14. The semiconductor storage device according to claim 1, wherein the semiconductor memory chip includes a NAND flash memory.

* * * * *